(12) United States Patent
Takao

(10) Patent No.: US 6,215,138 B1
(45) Date of Patent: Apr. 10, 2001

(54) SEMICONDUCTOR DEVICE AND ITS FABRICATION METHOD

(75) Inventor: Noriyuki Takao, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/292,631

(22) Filed: Apr. 15, 1999

(30) Foreign Application Priority Data

Apr. 16, 1998 (JP) .................................. 10-106498

(51) Int. Cl.⁷ .................................................. H01L 29/76
(52) U.S. Cl. .................... 257/288; 257/286; 257/287; 257/288; 257/338; 257/339; 257/355; 257/356; 257/368; 257/372; 257/373
(58) Field of Search ..................... 257/286, 287, 257/288, 338, 334, 355, 356, 368, 372, 373

(56) References Cited

U.S. PATENT DOCUMENTS

| | | | |
|---|---|---|---|
| 5,612,557 | * 3/1997 | Kondo et al. | 257/288 |
| 5,656,517 | 8/1997 | Efland et al. | 438/273 |
| 5,717,254 | * 2/1998 | Hashimoto | 257/773 |
| 5,831,338 | * 11/1998 | Kawamoto | 257/784 |
| 6,075,271 | * 6/2000 | Smith | 257/373 |

FOREIGN PATENT DOCUMENTS

| | | |
|---|---|---|
| 56-88363 | 7/1981 | (JP) . |
| 1-140773 | 6/1989 | (JP) . |
| 4-225569 | 8/1992 | (JP) . |
| 9-162395 | 6/1997 | (JP) . |

OTHER PUBLICATIONS

Japanese Office Action issued May 31, 2000 in a related application and English translation of relevant portions.

* cited by examiner

Primary Examiner—Eddie C. Lee
Assistant Examiner—Edgardo Ortiz
(74) Attorney, Agent, or Firm—Ostrolenk, Faber, Gerb & Soffen, LLP

(57) ABSTRACT

A source region 3 and a back-gate region 4 are alternately arranged along one side of a gate electrode 2 in a power MOSFET. The back-gate region 4 is formed so as not to substantially include the region immediately below the gate electrode 2. Thereby, it is possible to prevent a parasitic bipolar transistor from operating while controlling the increase of a channel resistance and thus, the breakdown resistance is improved.

15 Claims, 19 Drawing Sheets

SEMICONDUCTOR DEVICE AND ITS FABRICATION METHOD

CROSS REFERENCE TO RELATED APPLICATIONS

The present invention claims priority from Japanese Patent Application No. 10-106498 filed Apr. 16, 1998, the contents of which are incorporated herein by reference.

BACKGROUND OF THE INVENTION

1. Field of the Invention

The present invention relates to an FET provided with a back gate region structure, particularly to a power FET for controlling a high voltage and a large current.

2. Description of Related Art

A power FET is used to control a high voltage and a large current and, for example, used for the output stage of a motor-control IC. This type of the transistor is normally provided with a back gate region for keeping a threshold voltage constant.

A back gate region may be provided for a small-current MOSFET for logic but its structure is extremely different from that of a power MOSFET.

FIGS. 1 and 2 show a back gate region provided for a small-current MOSFET for logic. FIG. 1 shows a top view of the arrangement of regions of a drain, a gate, a source, and a back gate and FIG. 2 is a sectional view. In FIGS. 1 and 2, hatching for sectional views is omitted for simplification and a reference number is provided for only a drain region 1, a gate region 2, a source region 3, a back-gate region 4, a channel-forming region 6, a body well 7, a source electrode 12, and a drain electrode 13.

In the case of this example, potentials of the body well 7 and source region 3 including the channel-forming region 6 are equalized each other by the back-gate region 4. The back-gate region 4 and the body well 7 are contacted each other at a portion separate from the source region 3. When using the above structure, the distance between the back-gate region 4 and the channel-forming region 6 is increased and a parasitic resistance 8 is generated at the portion between the regions 4 and 6. However, because a large current does not normally flow through a back-gate region in the case of a small-current MOSFET, rise of the back-gate-region potential due to the parasitic resistance 8 does not frequently occur.

In the case of a power MOSFET, however, because a large current flows through a back-gate region, the parasitic resistance 8 occurs when using the above structure. That is, a potential difference occurs between the back-gate region 4 and the channel-forming region 6 due to the parasitic resistance 8 and thereby, a parasitic bipolar transistor operates which uses the channel-forming region 6 as a base and the drain region 1 and the source region 3 respectively adjacent to the region 6 as a collector and an emitter. Thereby, a large current flows through a body diode parasitically constituted of the back-gate region 4 and the source region 3. For example, when using a coil as a load, a voltage equal to or higher than the drain withstand voltage of a power MOSFET (that is, the withstand voltage of the body diode) due to the back electromotive force generated in the coil or higher is applied to the power MOSFET and thereby, the power MOSFET may be broken down. Moreover, when constituting an H bridge circuit, a forward-directional large current flows through a body diode and thereby, a latch-up phenomenon may occur.

To prevent the parasitic bipolar transistor from operating, it is effective to equalize the potential of the back-gate region serving as a base with that of the source region serving as an emitter. FIGS. 3 to 5 show a first prior art for equalizing the potential of a back-gate region with that of a source region. FIG. 3 is a top view of the arrangement of a gate electrode, a source region, and a back-gate region, and FIG. 4 is a sectional view of the arrangement taken along the line 4—4 of FIG. 3 and FIG. 5 is a sectional view of the arrangement taken along the line 5—5 of FIG. 3. This structure is disclosed in U.S. Pat. No. 5,656,517, in which a back-gate region 4 is formed in a source region 3. The potential of the back-gate region 4 is equalized with those of a body well 7 (region serving as the base of a parasitic bipolar transistor) and the source region 3 including a channel-forming region 6 by a source wiring and a source electrode 12.

FIGS. 6 and 7 show a second prior art provided with a back-gate region. FIG. 6 is an illustration showing the planar arrangement of a gate electrode, a source region, and a back-gate region and FIG. 7 is a sectional view of the arrangement taken along the line 7—7 of FIG. 6. This structure is disclosed in the official gazette of Japanese Patent Laid-Open No. 4-225569. This example has a structure in which the back-gate region 4 is extended up to the channel-forming region 6 immediately below the gate electrode. The back-gate region 4 is connected to the source electrode 12 and its potential is equalized with that of the body well 7 (region serving as the base of a parasitic bipolar transistor) including the channel-forming region 6.

Conventional examples related to a horizontal FET are described above. FIGS. 8 to 10 show a third prior art related to a vertical FET. FIG. 8 is an illustration showing the planar arrangement of a gate electrode, a source region, and a back-gate region, FIG. 9 is a sectional view of the arrangement taken along the line 9—9 of FIG. 8, and FIG. 9 is a sectional view of the arrangement taken along the line 10—10 of FIG. 8. The back-gate region 4 is formed in the source region 3. The potential of the back-gate region 4 is equalized with those of a body well 7 (region serving as the base of a parasitic bipolar transistor) and the source region 3 including a channel-forming region 6 by a source wiring.

The above prior arts respectively have a purpose for preventing a parasitic bipolar transistor from operating by equalizing the potential of a channel-forming region with that of a source region. However, each of the prior arts has the following problems.

In the case of the first prior art shown in FIGS. 3 to 5, because the back-gate region 4 is embedded in the source region 3, a parasitic bipolar transistor operates in which the resistance of the diffusion layer at the portion immediately below the source region serves as a parasitic base resistance. The parasitic bipolar transistor originally easily causes thermal runaway. Particularly, the breakdown tolerance dose when breaking down the junction by applying a high voltage between a collector and an emitter is too low, this is a problem. Moreover, in the case of the third prior art shown in FIGS. 8 to 10, because the back-gate region 4 is embedded in the source region 3, the resistance of the diffusion layer at the portion immediately below the source region serves as a parasitic base resistance and thereby, the same problem occurs.

However, the second prior art shown in FIGS. 6 and 7 makes it possible to reduce the above parasitic base resistance and prevent a parasitic bipolar transistor from operating by extending a part of the back-gate region 4 up to the region immediately below the gate electrode 2. However, the region immediately below the gate electrode 2 is the channel-forming region 6 of the FET and therefore, the back-gate region 4 breaks into the path of carriers discharged from the source region 3. Therefore, a problem occurs that a channel resistance increases. Because the back-gate region 4 is further horizontally expanded by undergoing heat treatment in the subsequent annealing step, the problem of increase of the channel resistance becomes more serious.

SUMMARY OF THE INVENTION

The present invention is made to solve the above problems and its object is to provide an FET capable of preventing a parasitic bipolar transistor from operating while controlling increase of a channel resistance and superior in breakdown resistance.

To solve the above problems, the first aspect of the present invention provides a semiconductor device comprising a semiconductor substrate, a gate electrode formed on the semiconductor substrate, and a one-conductivity-type channel-forming region formed on the portion immediately below the gate electrode, wherein an opposite-conductivity-type drain region is formed adjacently to one side of the channel-forming region, an opposite-conductivity-type source region and a one-conductivity-type back-gate region are alternately formed adjacently to the other side of the channel-forming region along the channel-forming region, the back-gate region does not substantially include the region immediately below the gate electrode, and the back-gate region and the source region are connected each other by a wiring.

In the case of the present invention, the description "the back-gate region does not substantially include the region immediately below the gate electrode" represents that a protrusion hardly interrupting the function of a channel region is permitted and thus, a protrusion hardly causing an on-resistance value to rise is permitted. For example, as described later, when forming a back-gate region through the ion implantation method by using a gate electrode as a mask, impurities is slightly diffused into the region immediately below the gate electrode. However, because the impurity concentration is very low, they do not greatly interrupt the channel-forming region. Thus, the protrusion of the above degree is permitted. Specifically, it is necessary to set the length of the protruded portion of the back-gate region preferably to 0.2 of a gate width or less, more preferably to 0.1 of it or less, or most preferably to 0.05 of it or less. Thus, it is possible to prevent an on-resistance ratio from increasing as described later.

In the case of the above structure, it is also possible to form a plurality of back-gate regions. In this case, it is preferable that every back-gate region has a portion contacting with the channel-forming region. This is because, if a back-gate region not contacting with the channel-forming region is present, a parasitic resistance occurs between the back-gate region and the channel-forming region.

Moreover, it is preferable that a back-gate region and a source region are arranged adjacently to each other. In this case, the description "adjacently to each other" represents that the back-gate region and the source region adjoin each other at an interval equal to or less than a mask misaligned distance when forming the regions. Thus, it is possible to improve the efficiency for layout and reduce on-resistance because the number of source regions can be maximized.

Furthermore, when assuming the total length of portions for source regions to contact with gates as x and the total length of portions for back-gate regions to contact with gates as y, it is necessary to set the value of y/x preferably in a range between 0.1 and 1.0 (both included), more preferably in a range between 0.2 and 0.8 (both included), or most preferably in a range between 0.3 and 0.7 (both included). As the number of back-gate regions is increased, it is possible to more securely control the operation of a parasitic bipolar transistor and further improve the breakdown resistance of a device but the source region is decreased and on-resistance increases. By setting the value of y/x in the above range, it is possible to improve the characteristics of breakdown resistance and on-resistance of a device. Moreover, for the same reason, it is preferable to set the length of the portion for each back-gate region to contact with a gate to a value ½ the gate-electrode width or less.

Moreover, it is preferable to form a structure in which a plurality of source regions and a plurality of back-gate regions are alternately arranged along a channel-forming region and back-gate regions are arranged at the both ends of the channel-forming region. Because electric fields are concentrated on the both ends when breakdown occurs, a device is easily broken down if source regions are arranged at the both ends. Therefore, by arranging back-gate regions at the both ends, it is possible to improve the breakdown resistance of the device.

The second aspect of the present invention provides a semiconductor device comprising a one-conductivity-type channel-forming region formed so as to extend in a predetermined direction, an opposite-conductivity-type first region formed along one side of the channel-forming region, an opposite-conductivity-type second region formed along a first portion of the other side of the channel-forming region facing one side of the opposite-conductivity-type first region, and a one-conductivity-type back-gate region formed along a second portion of the other side of the channel-forming region excluding the first portion; wherein the contact surface between the second region and the channel-forming region and the contact surface between the back-gate region and the channel-forming region are formed on the substantially same plane.

The third aspect of the present invention provides a semiconductor device comprising a one-conductivity-type channel-forming region formed so as to extend in a predetermined direction, an opposite-conductivity-type first region formed along one side of the channel-forming region, an opposite-conductivity-type second region formed along a first portion of the other side of the channel-forming region facing one side of the opposite-conductivity-type first region, and a one-conductivity-type back-gate region formed along a second portion of the other side of the channel-forming region excluding the first portion; wherein the contact surface between the second region and the channel-forming region and the contact surface between the back-gate region and the channel-forming region are formed on the substantially same plane so that the back-gate region does not interrupt the operation of carriers between the second region and the channel-forming region.

By making a back-gate region directly adjoin a channel-forming region, a parasitic base resistance which is a problem of the prior art is eliminated. Moreover, the contact surface between a second region and the channel-forming region (hereafter referred to as "contact surface A") and the contact surface between the back-gate region and the channel-forming region (hereafter referred to as "contact surface B") are formed on the substantially same plane and formed on the same plane so that the back-gate region does not interrupt the operation of carriers between the second region and the channel-forming region. Therefore, on-resistance is prevented from increasing. Moreover, the description "formed on the same plane so as not to interrupt the operation of carriers" represents that it is permitted that the position of each surface is slightly shifted as long as the contact surfaces A and B do not interrupt the operation of carriers even if the surfaces A and B are not completely matched each other. Specifically, it is necessary to set the positional shift between the contact surfaces A and B preferably to 0.2 of a gate width or less, more preferably to 0.1 of it or less, or most preferably to 0.05 of it or less. Thus, it is possible to prevent an on-resistance ratio from increasing.

Moreover, the fourth aspect of the present invention provides a semiconductor device comprising a semiconductor substrate, a gate electrode formed on the semiconductor substrate along the margin of a polygon or circle, and a one-conductivity-type channel-forming region formed on the portion immediately below the gate electrode, wherein an opposite-conductivity-type source region and a one-conductivity-type back-gate region are formed on the portion enclosed by the channel-forming region adjacently to the channel-forming region, an opposite-conductivity-type drain region is formed at the outside of the portion enclosed by the channel-forming region adjacently to the channel-forming region, the back-gate region does not substantially include the region immediately below the gate electrode, and the back-gate region and the source region are connected each other by wiring. In the case of the above structure, a drain region is formed "adjacently to the channel-forming region". However, it is enough that the drain region has at least a portion adjacent to the channel-forming region and a mode is permitted in which a drain region like a vertical FET expands in the longitudinal direction of a substrate.

In the case of the above structure, it is also possible to form a plurality of back-gate regions. In this case, it is preferable that every back-gate region has a portion contacting with the channel-forming region. This is because, if a back-gate region not having a portion contacting with the channel-forming region is present, a parasitic resistance is generated between the back-gate region and the channel-forming region.

Moreover, it is preferable that a gate electrode is formed on a semiconductor substrate so as to have a shape along the margin of a polygon. Thus, it is possible to arrange a plurality of semiconductor devices at a high density and obtain a structure suitable for a higher voltage and a larger current. In this case, the channel-forming region has a shape along the margin of a polygon. However, it is preferable that a back-gate region is formed at the inside of a corner of the polygon so as to contact with the channel-forming region. Because electric fields are concentrated on corners of a polygon when breakdown occurs, a device is easily broken down if a source region is formed on the corners. Therefore, it is possible to improve the breakdown resistance of a device by setting a back-gate region to corners of the polygon.

Furthermore, it is preferable that a back-gate region and a source region are arranged adjacently to each other and back-gate regions and source regions are formed substantially with no gap in the region enclosed by the gate electrode 2 formed along the margin of a polygon or circle. That is, it is preferable that a back-gate region and a source region are arranged adjacently to each other at an interval equal to or less than a mask misaligned distance when forming the regions. Thus, it is possible to improve the efficiency for layout and reduce on-resistance because the number of source regions can be maximized.

Furthermore, because the source region and the back-gate region are formed so as to be adjacent to the channel-forming region in the above structure, when assuming the total length of portions for source regions to contact with a channel-forming region as x and the total length of portions for back-gate regions to contact with the channel-forming region as y, it is necessary to set the value of y/x preferably in a range between 0.1 and 1.0 (both included), more preferably in a range between 0.2 and 0.8 (both included), or most preferably in a range between 0.3 and 0.7 (both included). As the number of back-gate regions is increased, it is possible to more securely control the operation of a parasitic bipolar transistor and further improve the breakdown resistance of a device, but on-resistance increases because a source region is decreased. By setting the value of y/x in the above range, it is possible to improve the characteristics of breakdown resistance and on-resistance of a device. For the same reason, it is preferable to set the length for each back-gate region to contact with a gate to a value ½ the gate-electrode width or less.

Another aspect of the present invention provides a semiconductor device comprising a semiconductor substrate, a one-conductivity-type body well formed nearby the surface of the semiconductor substrate, an opposite-conductivity-type source region and a one-conductivity-type back-gate region formed so as to be included in the body well, and a gate electrode formed on the semiconductor substrate along the margin of the body well so as to bestride the margin of the body well, wherein a channel-forming region is formed at the portion immediately below the gate electrode in the body well and the back-gate region is formed at the portion enclosed by the channel-forming region adjacently to the channel-forming region.

In the case of the above structure, the portion immediately below the gate electrode in the body well formed on the substrate serves as the channel-forming region. The back-gate region is formed at an internal lateral of channel-forming region and has a portion directly contacting with the channel-forming region not through the source region. Therefore, a parasitic bipolar transistor is eliminated. Because of the above structure, the back-gate region does not substantially include the region immediately below the gate electrode and thereby, a problem is solved that the back-gate region is horizontally expanded due to thermal diffusion.

Also in the case of the above structure, it is possible to form a plurality of back-gate regions. In this case, it is preferable that every back-gate region has a portion contacting with a channel-forming region. The is because, if a back-gate region not having a portion contacting with a channel-forming region is present, a parasitic resistance is generated between a back-gate region and a channel-forming region.

It is preferable that a gate electrode is formed on a semiconductor substrate so as to have a shape along the margin of a polygon. Thus, it is possible to arrange a plurality of the above semiconductor devices at a high density and form a structure suitable for a higher voltage and a larger current. In this case, because a channel-forming region has a shape along the margin of a polygon, it is preferable to form a back-gate region so as to contact with the channel-forming region at the inside of each corner of the polygon. Because electric fields are concentrated on corners of a polygon when breakdown occurs, a device is easily broken down if a source region is formed on the corner. Therefore, by forming a back-gate region on corners of a polygon, it is possible to improve the breakdown resistance of a device.

In the case of the above structure, it is preferable that a back-gate region and a source region are arranged adjacently to each other and back-gate regions and source regions are formed substantially with no gap at the portion enclosed by a channel-forming region formed into a shape along the margin of a polygon or circle. That is, it is preferable that a back-gate region and a source region are adjoined each other at an interval equal to or less than a mask misaligned distance when forming the regions. Thus, it is possible to improve the efficiency for layout and reduce on-resistance because the number of source regions can be maximized.

Moreover, in the case of the above structure, when assuming the total length of portions for source regions to contact with the above boundary as x and the total length of portions for back-gate regions to contact with the boundary as y, it is preferable to set the value of y/x preferably in a range between 0.1 and 1.0 (both included), more preferably in range between 0.2 and 0.8 (both included), or most preferably in a range between 0.3 and 0.7 (both included). As the number of back-gate regions is increased, it is possible to more securely control the operation of a parasitic bipolar transistor and further improve the breakdown resistance of a device but the number of source regions decreases and on-resistance increases. By setting the value of y/x in the above range, it is possible to improve the characteristics of breakdown resistance and on-resistance of a device. Moreover, for the same reason, it is preferable to set the length of a portion for each back-gate region to contact with a gate to a value ½ the gate electrode width.

Furthermore, still another aspect of the present invention provides a semiconductor-device fabrication method comprising the steps of forming a gate electrode on a semiconductor substrate and forming a one-conductivity-type source region at one side of the gate electrode and moreover forming a one-conductivity-type drain region and an opposite-conductivity-type back-gate region at the other side of the gate electrode so that the drain region and the back-gate region are alternately arranged through the ion implantation method by using the gate electrode as a mask.

Furthermore, still another aspect of the present invention provides a semiconductor-device fabrication method comprising the steps of alternately forming a one-conductivity-type drain well and an opposite-conductivity-type body well on a semiconductor substrate so as to be adjacent to each other, forming a gate electrode so as to bestride the boundary between the drain well and the body well, forming a one-conductivity-type drain region in the drain well though ion implantation by using the gate electrode as a mask, forming a one-conductivity-type source region in the body well through ion implantation by using the gate electrode as a mask, and forming an opposite-conductivity-type back-gate region in the body well through ion implantation by using the gate electrode as a mask.

In the case of this fabrication method, impurities is introduced by using a gate electrode as a mask. Therefore, a back-gate region is formed in a self-alignment manner and thus, the back-gate region does not protrude to the region immediately below a gate electrode. Moreover, a back-gate region and a source region are formed at the side of a channel-forming region so that the regions are alternately arranged. This arrangement is realized by masking a back-gate-region forming region when forming a drain region and a source region and masking a drain region and a source region when forming a back-gate region and then implanting impurities.

Furthermore, still another aspect of the present invention provides a semiconductor-device fabrication method comprising the steps of forming a one-conductivity-type drain region on a semiconductor substrate, forming a gate electrode having a shape along the margin of a polygon or circle on the surface of the drain region, introducing impurities into the region enclosed by the gate electrode by using the gate electrode as a mask to form an opposite-conductivity-type body well, introducing impurities into a part of the region enclosed by the gate electrode by using the gate electrode as a part of a mask to form a one-conductivity-type source region, and introducing impurities into a part of the region enclosed by the gate electrode by using the gate electrode as a part of a mask to form an opposite-conductivity-type back gate region.

In the case of this fabrication method, because impurities are introduced by using a gate electrode as a part of a mask, a back-gate region is formed in a self-alignment manner and therefore, the back-gate region does not protrude into the region immediately below the gate electrode. Though ion implantation is preferable as impurity introduction means, it is also possible to use the gas diffusion method.

Though a drain region can be formed through epitaxial growth, it is also possible to use a method for forming a well through ion implantation.

In the case of various semiconductor-device fabrication methods of the present invention, the sequence for forming a drain region, a source region, and a back-gate region is not restricted. However, it is preferable that the steps of forming a source region and a back-gate region are continued because of the restriction on steps.

BRIEF DESCRIPTION OF THE DRAWINGS

The structure and functions of the present invention are described below by referring to the accompanying drawings.

FIGS. 1 and 2 are illustrations showing a back-gate region to be provided for a small-current MOSFET for logic, in which FIG. 1 is a top view showing the arrangement of drain, gate, source, and back-gate regions and FIG. 2 is a sectional view taken along the line 2—2 of FIG. 1;

FIGS. 3 to 5 are illustrations showing a first prior art for equalizing the potential of a back-gate region with that of a source region, in which FIG. 3 is a top view showing the arrangement of a gate electrode, a source region, and a back-gate region, FIG. 4 is a sectional view taken along the line 4—4 of FIG. 3, and FIG. 5 is a sectional view taken along the line 5—5 of FIG. 3;

FIGS. 6 and 7 are illustrations showing a second prior art provided with a back-gate region, in which FIG. 6 is a top view showing the arrangement of a gate electrode, a source region, and a back-gate region and FIG. 7 is a sectional view taken along the line 77 of FIG. 6;

FIGS. 8 to 10 are illustrations showing the prior art for a vertical FET, in which FIG. 8 is a top view showing the arrangement of a gate electrode, a source region, and a back-gate region, FIG. 9 is a sectional view taken along the line 9—9 of FIG. 8, and FIG. 10 is a sectional view taken along the line 10—10 of FIG. 8;

FIGS. 11 to 13 are illustrations showing the first embodiment of the present invention, in which FIG. 1 is a top view showing the arrangement of a drain region, a gate electrode, a source region, and a back-gate region, FIG. 12 is a sectional view taken along the line 12—12 of FIG. 11, and FIG. 13 is a sectional view taken along the line 13—13 of FIG. 11;

FIGS. 22 to 24 are illustrations showing the second embodiment of the present invention, in which FIG. 22 is a top view showing the arrangement of a gate electrode, a source region, and a back-gate region, FIG. 23 is a sectional view taken along the line 23—23 of FIG. 22, and FIG. 24 is a sectional view taken along the line 24—24 of FIG. 22;

FIGS. 25 to 27 are illustrations showing a modification of the second embodiment of the present invention, in which FIG. 25 is a top view showing the arrangement of a gate electrode, a source region, and a back-gate region, in which FIG. 26 is a sectional view taken along the line 26—26 of FIG. 25 and FIG. 27 is a sectional view taken along the ling 27—27 of FIG. 25;

FIGS. 28 to 30 are illustrations showing a reference example, in which FIG. 28 is a top view showing the arrangement of a gate electrode, a source region, and a back-gate region, FIG. 29 is a sectional view taken along the line 29—29 of FIG. 28, and FIG. 30 is a sectional view taken along the line 30—30 of FIG. 28;

FIG. 32 is a sectional view taken along the line 32—32 of FIG. 31, and FIG. 33 is a sectional view taken along the line 33—33 of FIG. 31;

FIGS. 34 and 35 are illustrations showing still another embodiment of the present invention, in which FIG. 34 is a top view showing the arrangement of the embodiment and FIG. 35 is a sectional view including a back-gate region;

FIGS. 36 to 38 are illustrations showing still another embodiment of the present invention, in which FIG. 36 is a top view showing the arrangement of a drain region, a gate electrode, a source region, and a back-gate region, FIG. 37 is a sectional view taken along the line 37—37 of FIG. 36, and FIG. 38 is a sectional view taken along the line 38—38 of FIG. 36; and FIGS. 39 to 41 are illustrations showing still another embodiment of the present invention, in which FIG. 39 is a top view showing the arrangement of a drain region, a gate electrode, a source region, and a back-gate region, FIG. 40 is a sectional view taken along the line 40—40 of FIG. 39, FIG. 41 is a sectional view taken along the line 41—41 of FIG. 39.

DETAILED DESCRIPTION OF THE PREFERRED EMBODIMENTS

Figure 11:
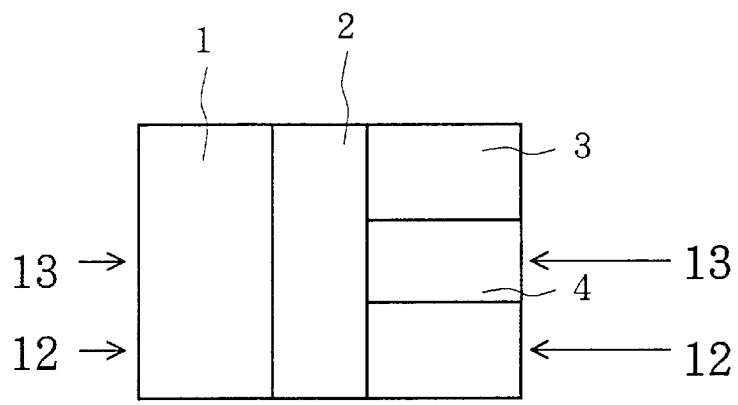
Figure 12:
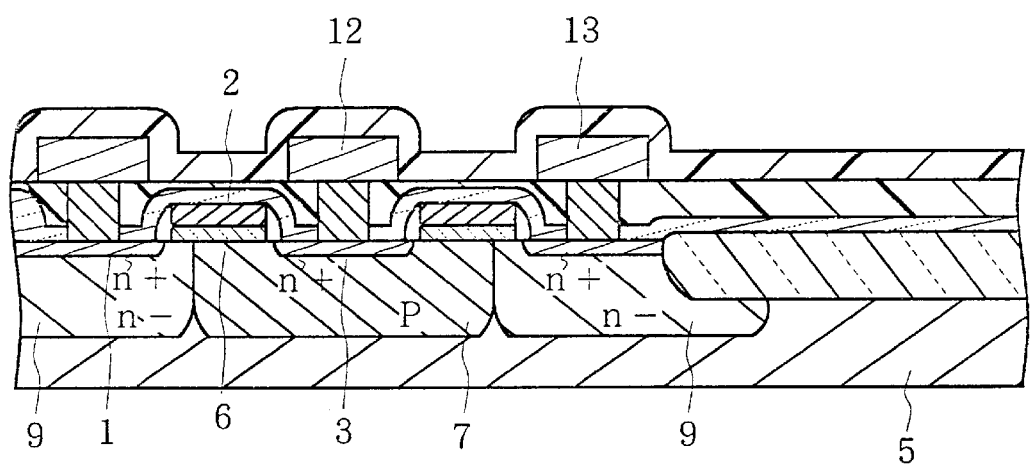
Figure 13:
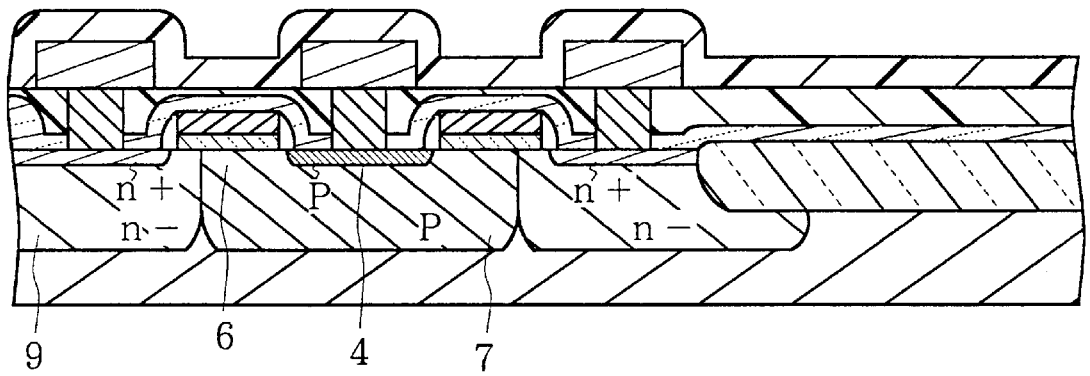
Figure 14:
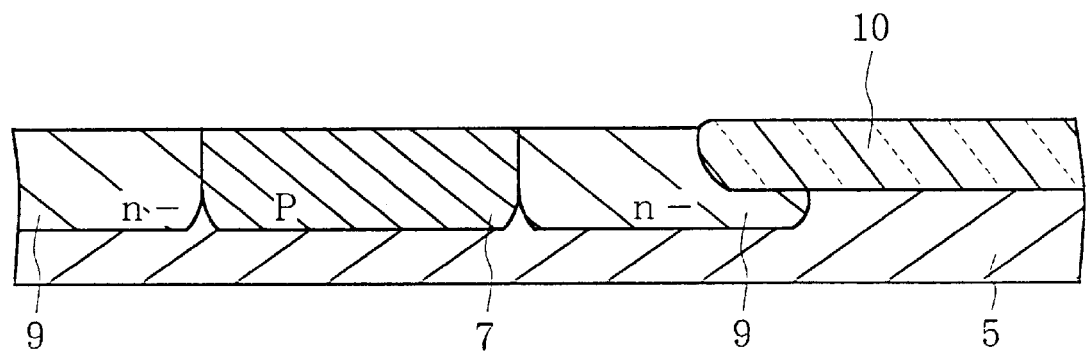
FIGS. 14 to 17 are sectional views showing steps of fabricating the first embodiment.

A basic embodiment of the present invention is described below by referring to FIGS. 11 to 13. FIG. 11 is a top view showing the arrangement of a drain region, a gate electrode, a source region, and a back-gate region, in which FIG. 12 is a sectional view taken along the line 12—12 of FIG. 11 and FIG. 13 is a sectional view taken along the line 13—13 of FIG. 11.

Figure 1:
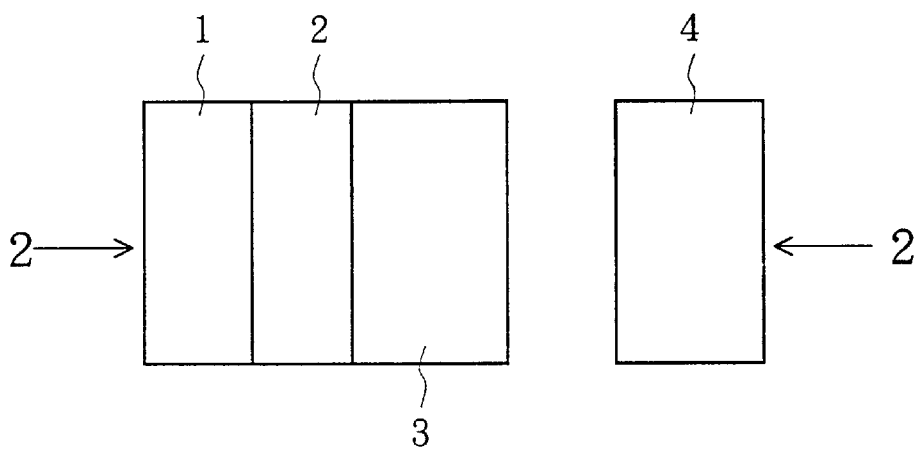
Figure 2:
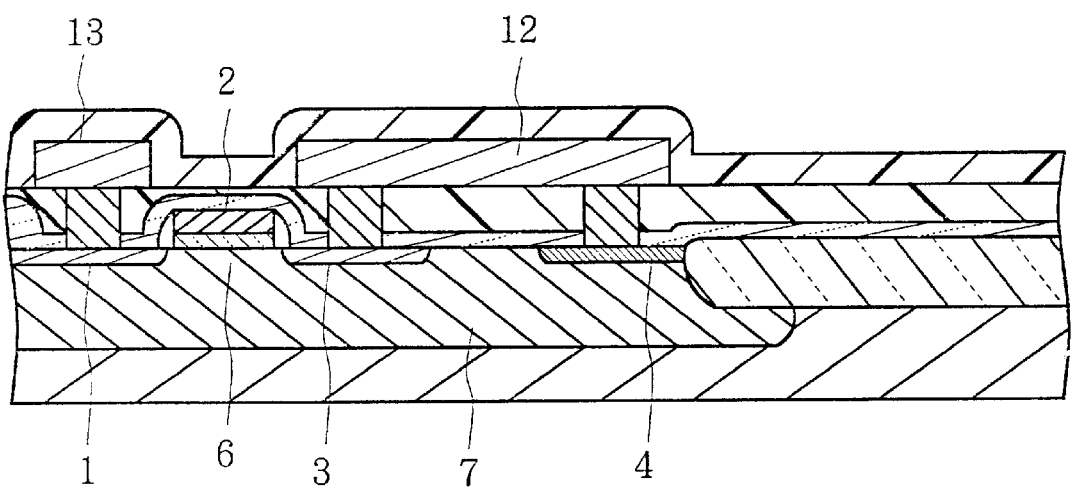
Figure 3:
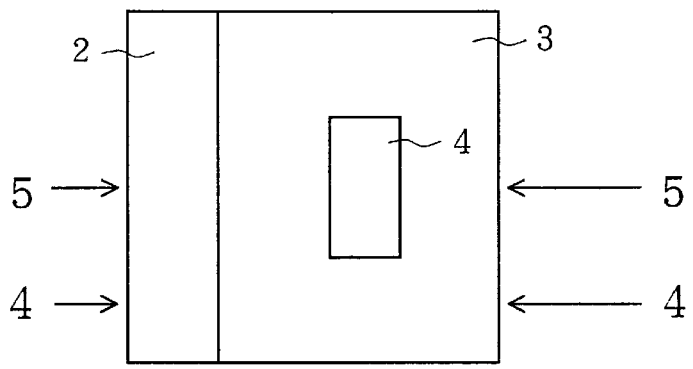
Figure 4:
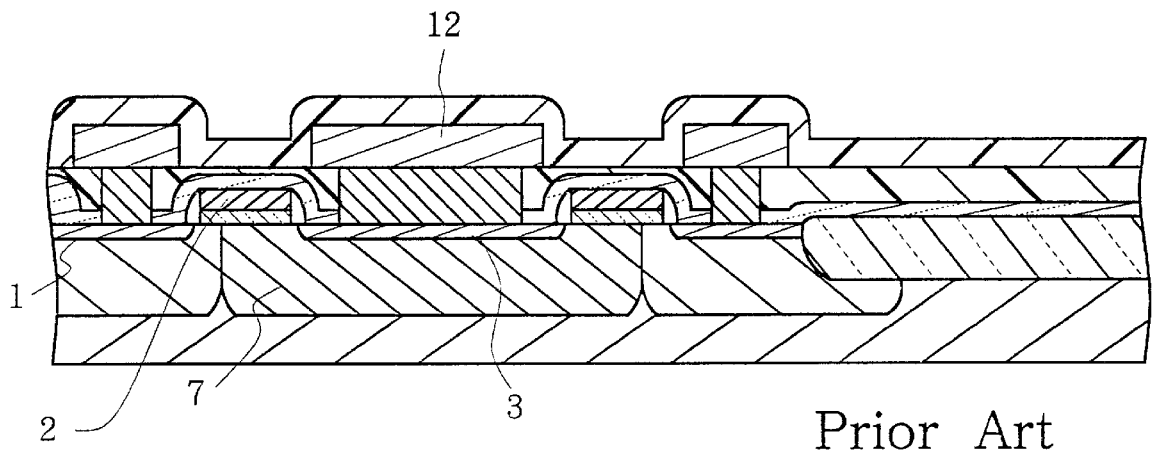
Figure 5:
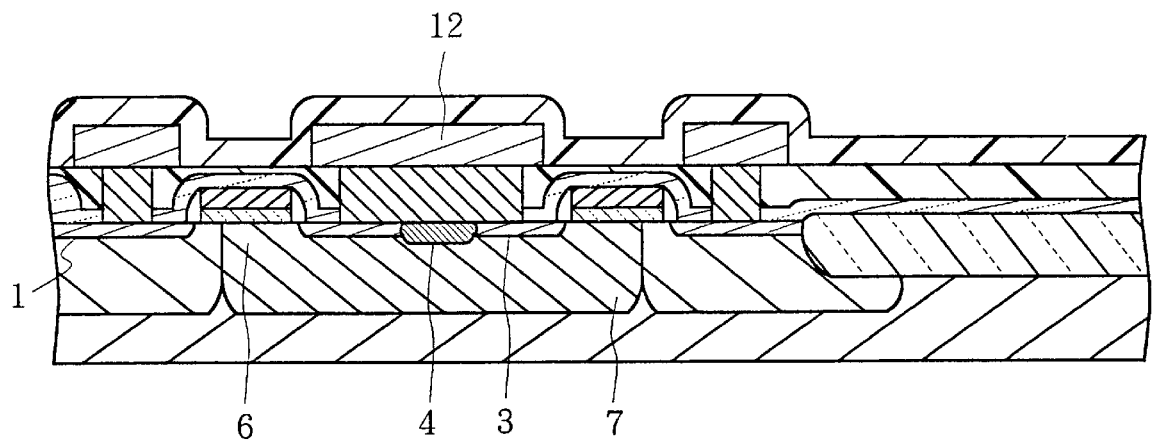

As shown in FIG. 11, the gate electrode is extended in a predetermined direction and the back-gate region 4 and the source region 3 are alternately arranged along a channel-forming region 6 immediately below the gate electrode. Because the above arrangement is used, the back-gate region is directly adjacent to the channel-forming region (FIG. 13). In the case of the prior art shown in FIGS. 3 to 5, because a source region 3 is formed between a back-gate region 4 and a channel-forming region 6, a parasitic base resistance is generated at the portion immediately below the source region 3. In the case of this embodiment, however, a parasitic base resistance is eliminated because the back-gate region 4 and the channel-forming region 6 are adjacent to each other.

This embodiment is more minutely described below. The gate electrode is formed on a one-conductivity-type substrate 5 and the channel-forming region 6 is formed immediately below the gate electrode. A one-conductivity-type body well 7 is formed so as to contain the channel-forming region 6 and an opposite-conductivity-type drain well 9 is formed adjacently to the body well 7 (FIGS. 12 and 13). The opposite-conductivity-type source region 3 and the one-conductivity-type back-gate region 4 are alternately arranged adjacently to and along the channel-forming region 6 (FIG. 11). The back-gate region 4 is formed so as not to substantially include the region immediately below the gate electrode 2. The back-gate region 4 is connected with the source region 3 by source wiring to fix the base potential of a parasitic bipolar transistor to the potential of the source region without interrupting a channel current. Thereby, it is possible to control the operation of the parasitic bipolar transistor constituted of the drain region 1, channel-forming region 6, and source region 3 and improve the breakdown resistance while it is possible to minimize the increase of on-resistance because the portion where the source region 3 contacts with the channel-forming region 6 is secured to a certain extent.

In the case of this embodiment, when assuming the total length of portions for source regions 3 to contact with the channel-forming region 6 as x and the total length of portions for back-gate regions 4 to contact with channel-forming region 6 as y, the value of y/x is equal to 0.7.

A method for fabricating this embodiment is described below by referring to FIGS. 14 to 17.

First, ions are implanted into the surface of an n-type substrate 5 by using photoresist as a mask to form an n-type low-concentration drain well 9 and a p-type body well 7 (FIG. 14) and the number of impurities to be implanted is set to approx. $10^9$ cm$^{-2}$ for the drain well 9 and $10^{11}$ cm$^{-2}$ for the body well 7. Though it is preferable to form these regions so that they do not intersect each other, it is permitted that they are slightly intersected each other as long as a concentration is stabilized. Then, a LOCOS oxide film 10 is formed for device separation.

The profiles of the drain well 9 and the body well 7 in the impurity depth direction re properly set in accordance with necessary withstand voltage and on-resistance. It is referable to control the profiles in accordance with the dose for ion implantation at a turn-on voltage (threshold voltage) capable of obtaining the surface concentration of the body well 7.

Figure 15:
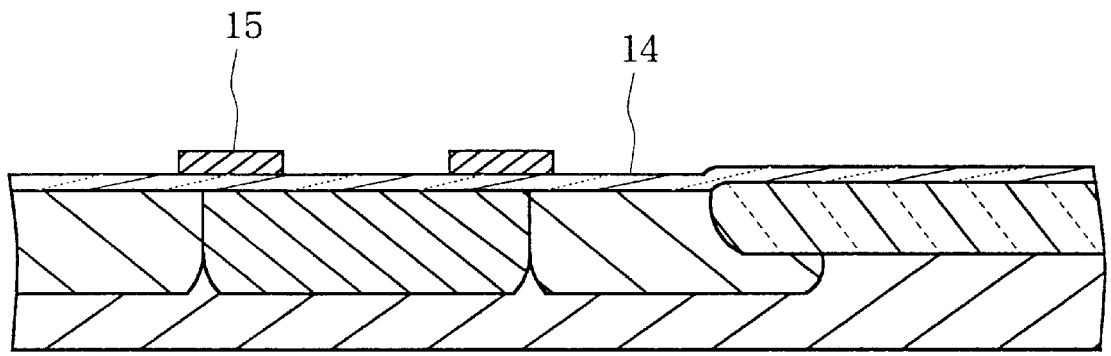

Then, a gate oxide film 14 is formed through thermal oxidation to deposit polysilicon through CVD. Then, polysilicon is plasma-etched so that the gate electrode 2 is left on a portion serving as the channel-forming region 6. The gate electrode 2 is formed so as to bestride the boundary between the drain region 1 and the channel-forming region 6 (FIG. 15).

Figure 16:
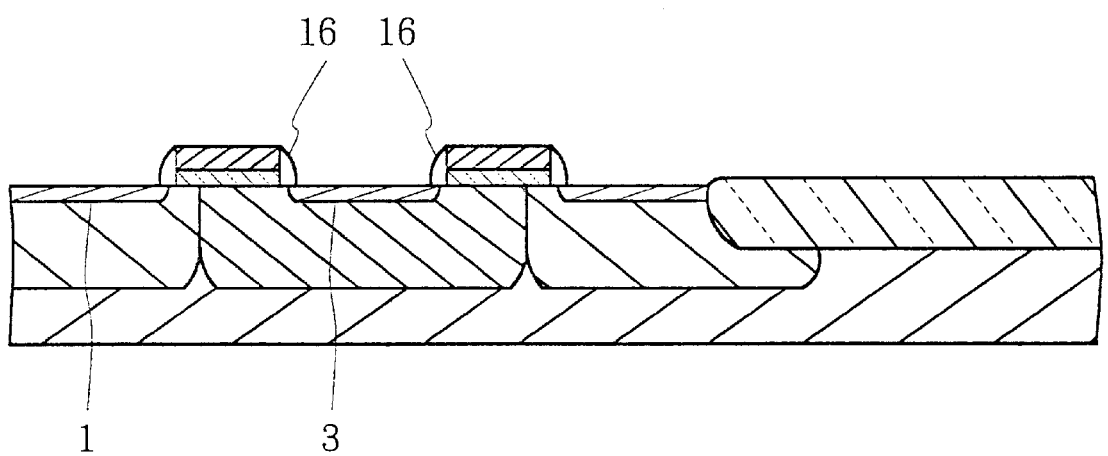

Then, the high-concentration source region 3 and drain region 1 are formed through n-type ion implantation after masking the portion of the back-gate region 4 with photoresist (FIG. 16). The number of impurities to be implanted is set to approx. $10^{15}$ cm$^{-2}$. In FIG. 16, reference number 16 denotes a side oxide film.

Figure 17:
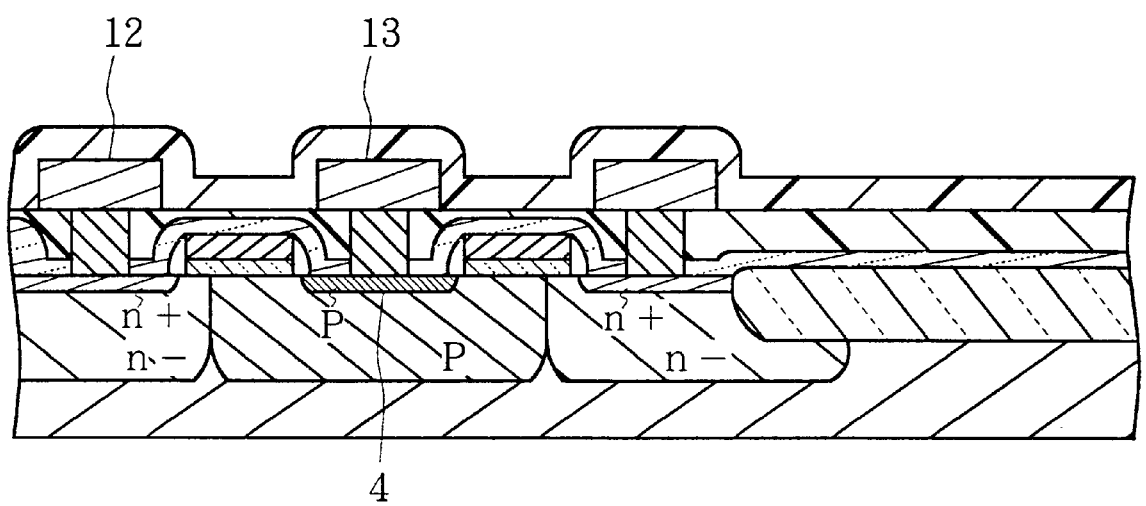

Thereafter, the p-type high-concentration back-gate region 4 is formed through ion implantation after leaving photoresist so as to mask the drain-source region 3 (FIG. 17). The number of impurities to be implanted is set to approx. $10^{15}$ cm$^{-2}$. The back-gate region 4 and the source region 3 are alternately arranged along the gate electrode 2. FIG. 17 shows a sectional view of a portion including the back-gate region 4. Finally, a drain electrode 13 is connected to the drain region 1 to connect the source region 3 and the back-gate region 4 to the source electrode 12 by a common source wiring. Each of these electrodes is connected to an extern terminal together with the gate electrode 2.

Thus, the back-gate region 4 and the source region are alternately arranged and formed so as to be adjacent to the channel-forming region 6. Thereby, the back-gate region 4 is directly adjacent to the channel-forming region 6. Moreover, the back-gate region 4 is constituted so as not to substantially include the channel-forming region 6 immediately below a gate. When using the ion implantation method, though impurities are slightly diffused in the horizontal direction, the impurity concentration is very small and therefore, impurities do not greatly interrupt the channel-forming region 6. Moreover, by decreasing the energy for ion implantation, it is also possible to further decrease the diffusion in the horizontal direction.

According to the method of this embodiment, it is possible to fabricate the power FET having the above structure without passing through complicated steps because ions are implanted by self-aligning the gate electrode-2 portion with a mask. That is, in the case of the method of this embodiment, a source region and the back-gate region 4 are efficiently arranged by using the gate electrode 2 as a part of a mask and the MOSFET having the above structure can be fabricated by using the normal MOSIC fabrication process. By efficiently arranging the above back-gate region 4 and the source region, advantages are obtained that on-resistance is reduced and parasitic-bipolar operations are controlled.

Figure 18:
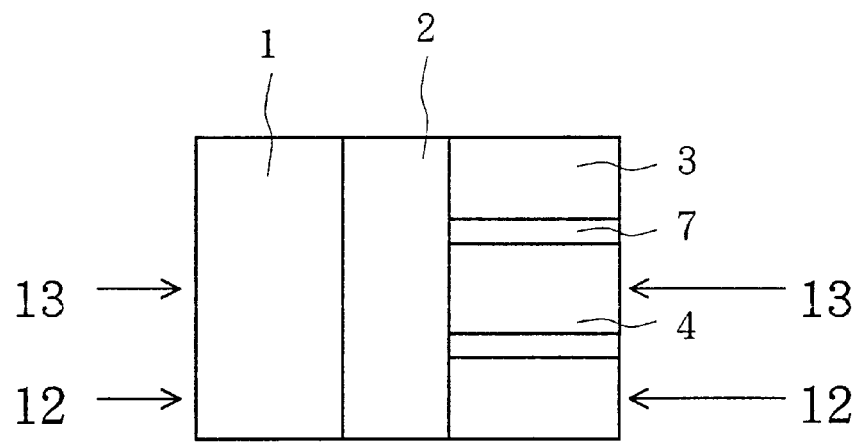
FIG. 18 is an illustration showing the arrangement of a drain region, a gate electrode, a source region, and a back-gate region of a modification of the first embodiment.

Though the source region 3 and the p-type back-gate region 4 are alternately formed along the channel-forming region 6, it is preferable to arrange these regions so as to be adjacent to each other like the case of this embodiment. For example, as shown in FIG. 18, it is also possible to form a structure in which the source region 3 and the back-gate region 4 are separate from each other. In this case, however, it is preferable to minimize the interval between the both regions 3 and 4 in order to improve the efficiency for layout.

In the case of the above embodiment, it is also possible to use the normal gas diffusion or solid-phase diffusion, or use thermal diffusion together for ion implantation. In this case, the back-gate region 4 slightly protrudes to the channel-forming region 6 due to horizontal expansion due to the thermal diffusion. However, this does not damage the essence of the present invention. Moreover, by previously considering the horizontal diffusion from the gate electrode 2 and thereby, using a mask for the back-gate region 4 instead of self-alignment of a gate, it is possible to form the back-gate region 4 with no protrusion.

Advantages obtained from the above embodiment are described below by referring to FIGS. 19 to 21.

Figure 19:
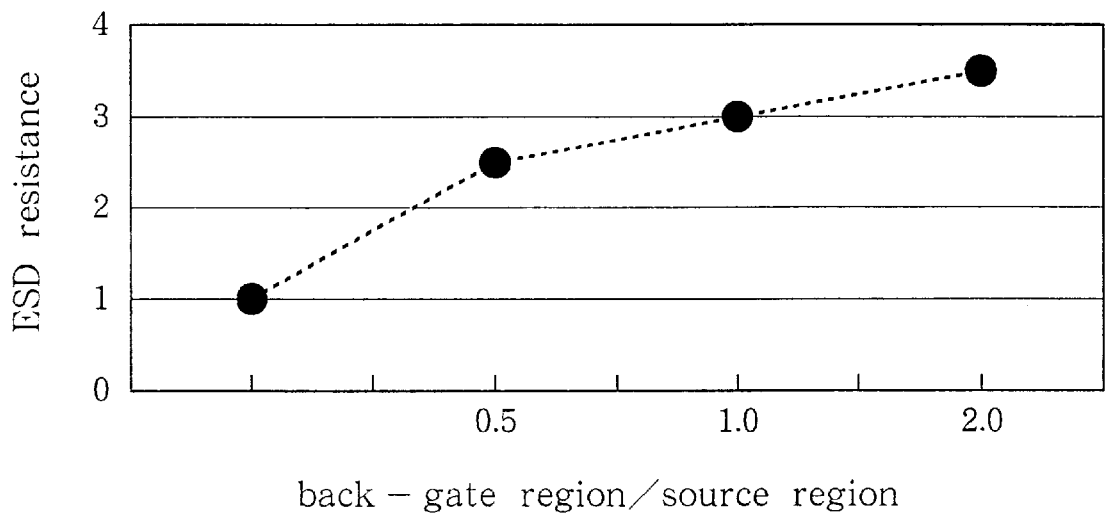
FIG. 19 is a graph showing the relation between back-gate region/source-region ratio and breakdown resistance.

FIG. 19 shows the influence of the ratio of back-gate region/source region on a breakdown resistance value in the power FET shown in FIG. 11. The x-axis shows the value of y/x when assuming the total length of portions for back-gate regions 4 to contact with the channel-forming region 6 as x and the total length of portions for back-gate regions 4 to contact with the channel-forming region 6. In the case of the embodiment shown in FIG. 11, the value of y/x is equal to the area ratio of back-gate region/source region. In the case of the conventional FET (hereafter referred to as conventional FET1) shown in FIGS. 3 to 5, the value of y becomes 0 because the back-gate region 4 does not contact with the channel-forming region 6. Moreover, the y-axis shows breakdown resistance value, in which an ESD resistance value according to the MIL method is used as an index. The ESD resistance value is shown by a ratio when assuming the ESD resistance value of the conventional FET1 shown in FIGS. 3 to 5 as 1.

Figure 20:
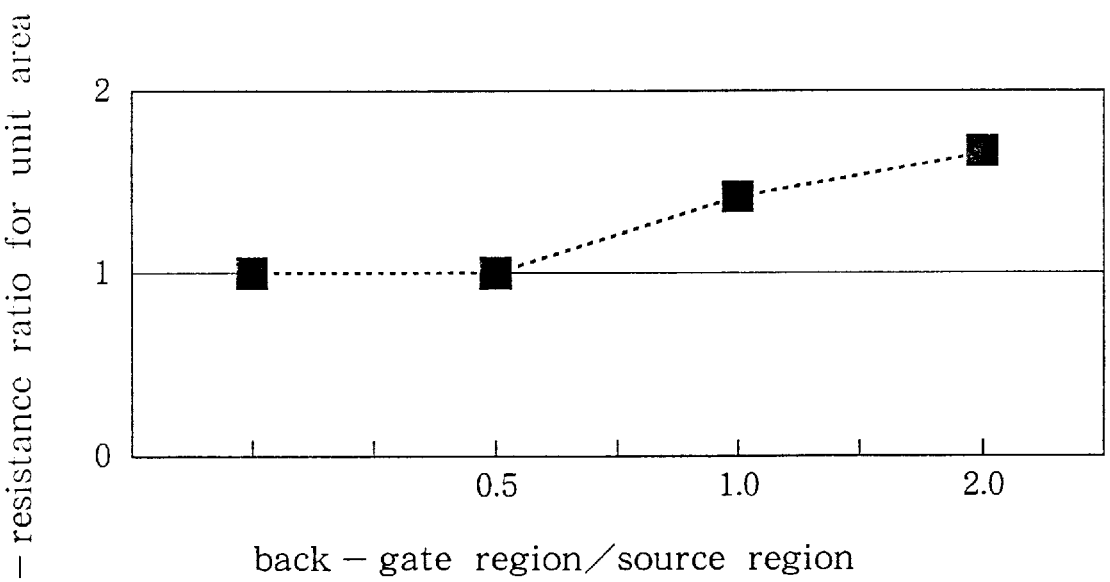
FIG. 20 is a graph showing the relation between back-gate region/source-region ratio and on-resistance ratio.
Figure 21:
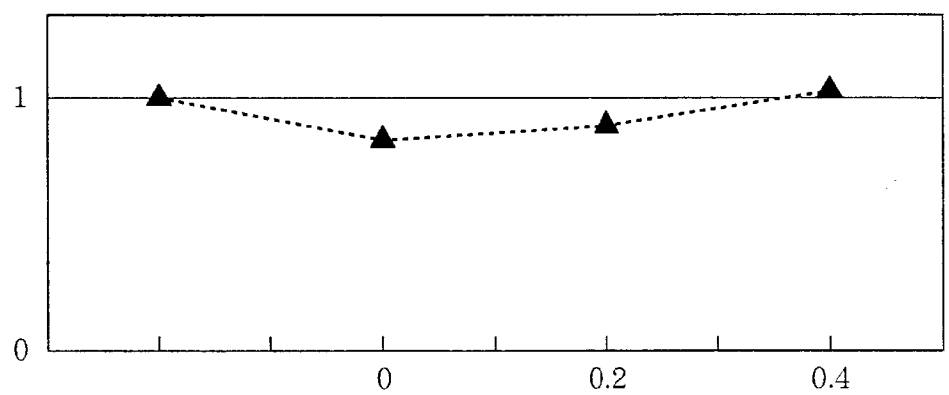
FIG. 21 is a graph showing the relation between back-gate-region protruded length and on-resistance ratio.

FIG. 20 shows the influence of the ratio of back-gate region/source region on on-resistance. The x-axis shows the same as the case of FIG. 19. The y-axis shows the on-resistance ratio for unit area obtained by dividing an on-resistance value by the area of the source region 3, which is shown by a ratio when assuming the on-resistance of the conventional FET1 shown in FIGS. 3 to 5 as 1 and using the same gate-voltage•drain-current density.

In the case of the conventional FET1, the gate-electrode using rate is high because carrier discharge from a source region is performed along a gate electrode. However, because a width (horizontal direction of FIGS. 3 to 5) for including the back-gate region 4 inside is necessary, the horizontal width of the source region 3 cannot be greatly decreased and thereby, the area of the source region 3 is increased to a certain extent. Therefore, the on-resistance ratio for unit area becomes almost equal to that of this embodiment. Thus, by setting the value of y/x to 0.5 or more for arrangement of the back-gate region 4 of this embodiment, it is found that the ESD resistance value can be increased two times or more while setting the on-resistance ratio for unit area to a value almost equal to the conventional value.

Figure 6:
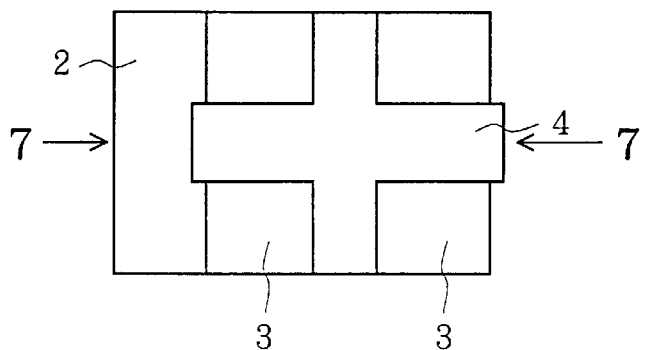
Figure 7:
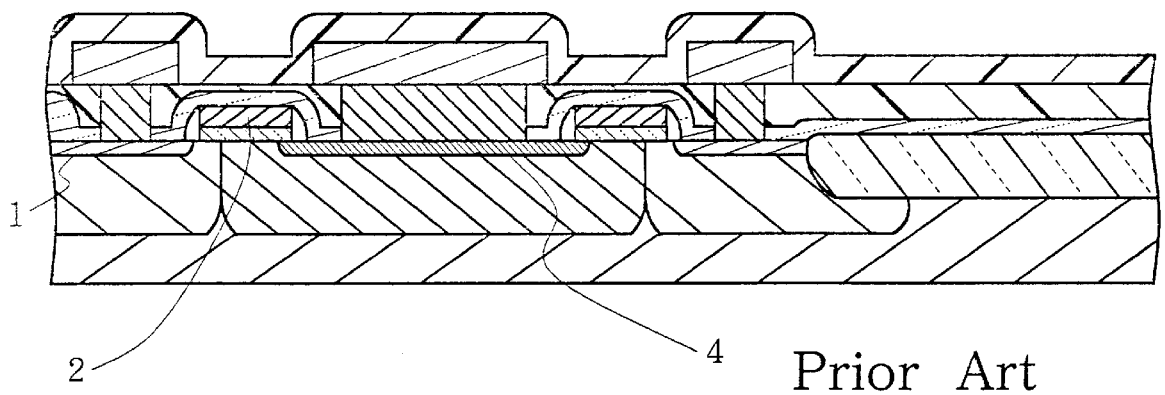

Then, comparison with the conventional FET (hereafter referred to as FET2) shown in FIGS. 6 and 7 is described below. The conventional FET2 has a structure in which the back-gate region 4 protrudes up to the region immediately below a gate electrode. The x-axis shows the ratio of the length of the protruded portion to a gate width. In the case of this embodiment shown in FIG. 11, because the back-gate region 4 does not protrude, the protrusion length corresponds to the point 0 and the on-resistance ratio is minimized.

Though the above embodiment uses an FET having an n-channel horizontal drain structure, the embodiment of a vertical-drain n-channel FET is described below.

Figure 22:
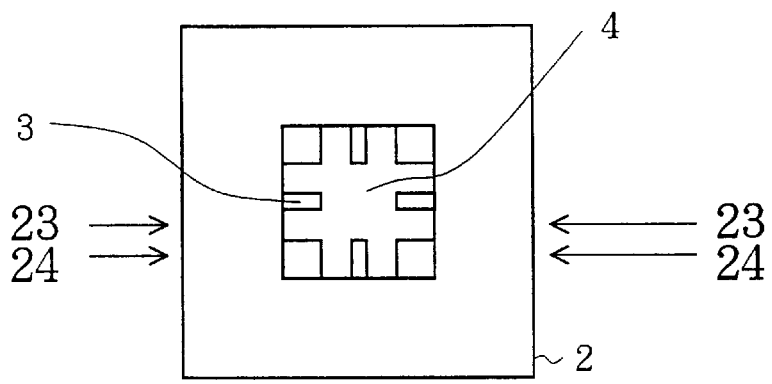
Figure 23:
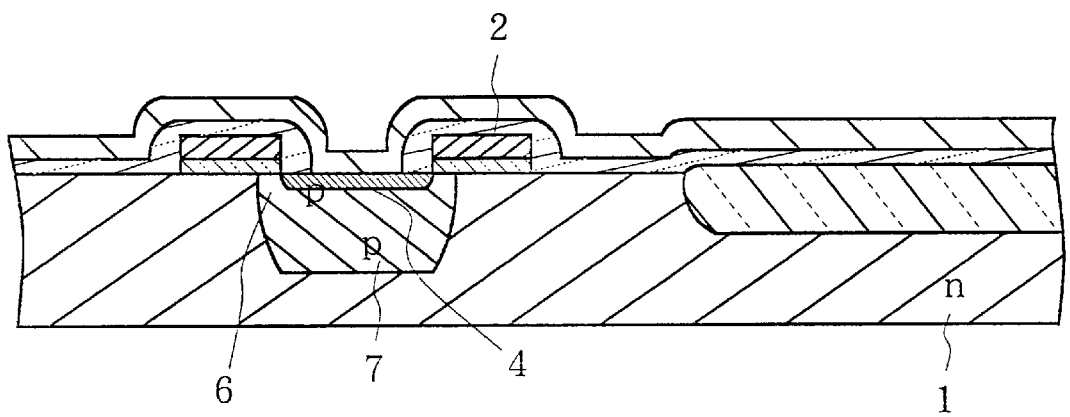
Figure 24:
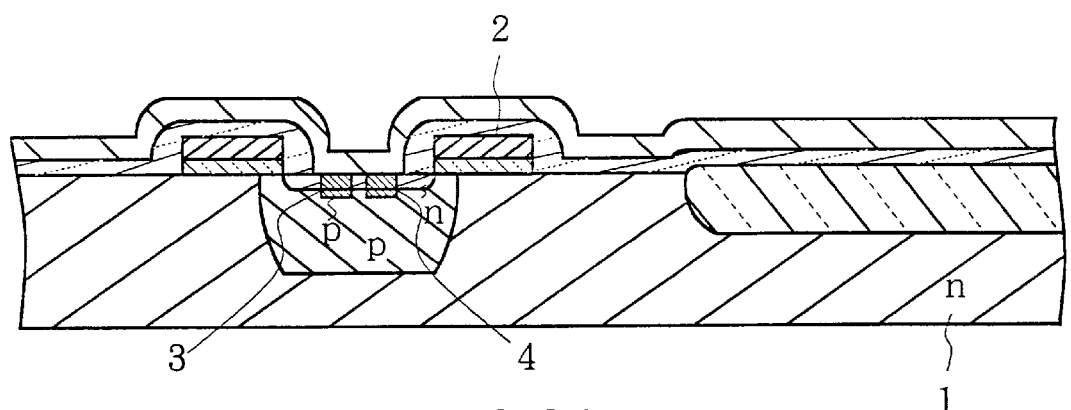

FIGS. 22 to 24 are illustrations showing the second embodiment of the present invention, in which FIG. 22 is a top view showing the arrangement of a gate electrode, a source region, and a back-gate region, FIG. 23 is a sectional view taken along the line 23—23 of FIG. 22, and FIG. 24 is a sectional view taken along the line 24—24 of FIG. 22. In the case of this embodiment, a gate electrode 2 is formed into a shape along the margin of a polygon and a back-gate region 4 and a source region 3 are arranged so as to contact with the internal lateral of a channel-forming region 6 immediately below the gate electrode 2. Because of using the above arrangement, the back-gate region 4 has a portion directly adjacent to the channel-forming region 6 without passing through the source region 2. In the case of the above third prior art (FIG. 27), because the source region 3 is present between the back-gate region 4 and the channel-forming region 6, the parasitic base resistance 8 is generated at the portion immediately below the source region 3. In the case of the present invention, however, a parasitic base resistance is eliminated because the back-gate region 4 and the channel-forming region 3 are adjacent to each other. Moreover, in the case of this embodiment, the back-gate region 4 is formed so as not to substantially include the region immediately below the gate electrode 2. Therefore, the problem of the above-described second prior art is solved that a channel resistance increases. Furthermore, because the back-gate region 4 can be formed after the gate electrode 2 is formed, the problem is solved that the back-gate region 4 expands in the horizontal direction due to thermal diffusion.

The structure shown in FIGS. 22 to 24 is more minutely described below. It is possible to form the gate electrode 2 into a shape along the margin of a polygon or circle. When forming the electrode 2 into a polygon, it is preferable to form a shape in which a plurality of FETs can be arranged at a high density such as a quadrangle or hexagon. The gate electrode 2 is formed along the margin of a body well 7 formed nearby the surface of a semiconductor substrate 5 so as to bestride the margin of the body well 7. Therefore, the region immediately below the gate electrode in the body well 7 serves as the channel-forming region 6. Moreover, the source region 3 and the back-gate region 4 are formed so as to be enclosed by the body well 7. The back-gate region 4 is formed so as to contact with the channel-forming region 6 immediately below the gate electrode. That is, the back-gate region 4 has a portion directly contacting with the channel-forming region 6 without passing through the source region 3. Therefore, a parasitic resistance is not generated immediately below the source region 3, which is a problem of the prior art, and the channel-forming region 6 and the back-gate region 4 are connected with the source region 3 by a source wiring and fixed to the same potential. That is, the base potential of a parasitic bipolar transistor is fixed to an emitter potential. Thereby, operations of the parasitic bipolar transistor constituted of a drain region 1, the channel-forming region 6, and the source region 3 and the breakdown resistance is improved. Moreover, the shape of the back-gate region 4 in the plane direction is grid-like, the source region 3 having a certain area is secured while securing a portion where the back-gate region 4 contacts with the channel-forming region 6, and a portion where the source region 3 contacts with the channel-forming region 6 is secured to a certain extent. Therefore, it is possible to minimize the increase of on-resistance.

In the case of a vertical FET having a conventional structure, when decreasing the area of the back-gate region 4, the effect for controlling operations of a parasitic bipolar transistor is deteriorated. Therefore, an area 1.2 times larger than the area of the source region 3 is necessary. In the case of this embodiment, however, there is a sufficient effect for controlling operations of a parasitic bipolar transistor even for approx. 30% of a source region area and therefore, it is possible to decrease a device area. In the case of the above structure, shapes of the source region and the back-gate region 4 are basically optional. Therefore, the effect is maintained even if forming the shapes into rectangles and reducing the back-gate region 4 at the central portion. In this case, it is possible to further decrease the area.

When assuming the total length of portions for source regions 3 to contact with the channel-forming region 6 as x and the total length of portions for back-gate regions 4 to contact with the channel-forming region 6 as y, the value of y/x is equal to 0.6.

A method for fabricating an FET having the above structure is described below.

First, a low-concentration drain region 1 is formed on an n-type high-concentration substrate 5 through expitaxial growth and a gate electrode 2 is left like a mesh to form a p-type body well 7 serving as a channel-forming region 6 through the hole. The number of impurities to be implanted is set to approx. $10^9$ cm$^{-2}$. In the case of this embodiment, the ion implantation method is used to introduce impurities. However, it is also possible to use gas diffusion. By performing thermal treatment, p-type impurities diffuse also in the horizontal direction and enter the portion immediately below the gate electrode 2 to form a channel. High-concentration n-type impurities serving as a source region 3 are introduced into the same window and then, p-type impurities serving as a back-gate region 4 are introduced. The number of impurities for forming the source region and the back-gate region is set to approx. $10^{14}$ cm$^{-2}$. The back-gate region 4 is formed in self-alignment manner by using the gate electrode-2 portion as a mask similarly to the case of the first embodiment. Thereby, the back-gate region 4 is directly adjacent to the channel-forming region 6. Moreover, the back-gate region 4 has a structure not substantially including the channel-forming region 6 immediately below a gate. Finally, by connecting a source region with the back-gate region 4 by a wiring, it is possible to fabricate the essential portion of the FET.

According to the above method, it is possible to fabricate a power FET having the above structure without passing through complicated steps because ions are implanted by using the gate electrode-2 portion as a mask. That is, in the case of the method of this embodiment, a source region and the back-gate region 4 are efficiently arranged by using the gate electrode-2 portion as a part of a mask and it is possible to fabricate a MOSFET having the above structure by using the normal MOSIC fabrication process. According to the above efficient arrangement of back-gate regions 4 and source regions, advantages are obtained that on-resistance is reduced and parasitic-bipolar operations are controlled.

Figure 25:
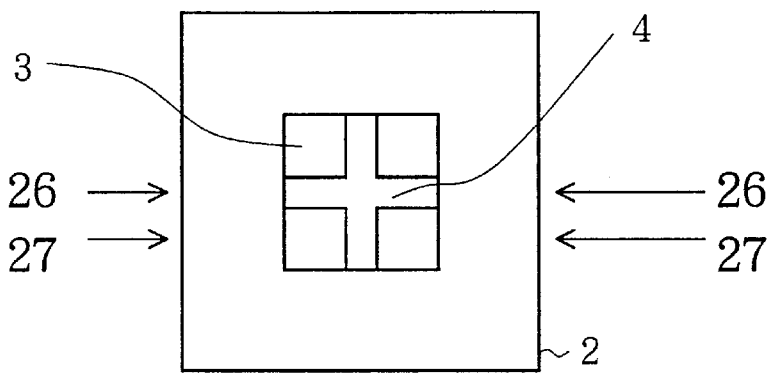
Figure 26:
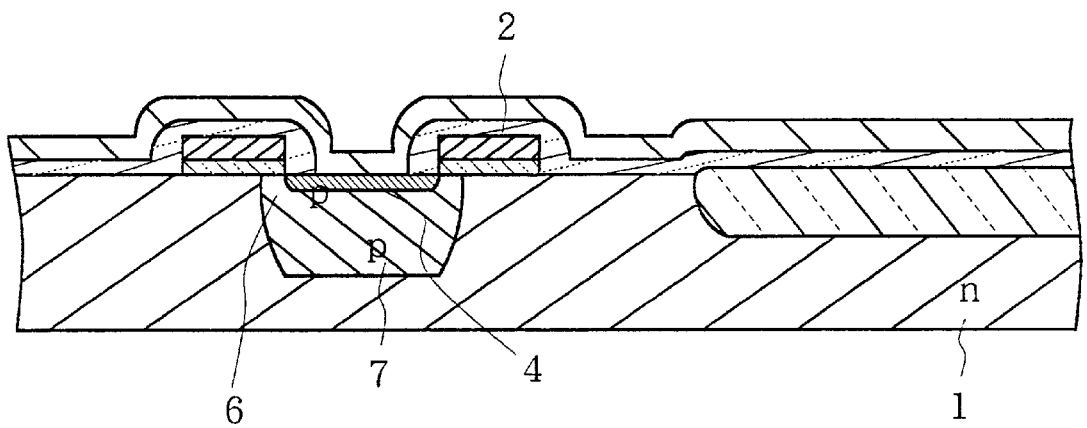
Figure 27:
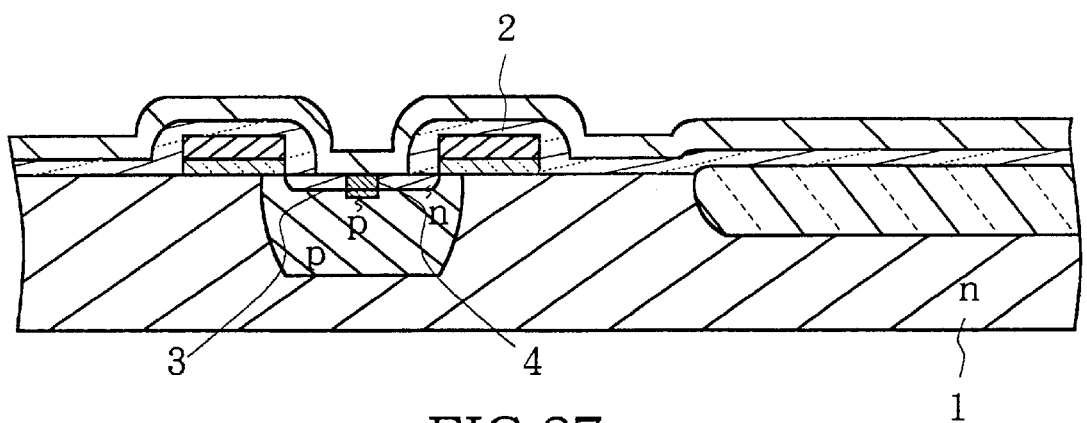

FIGS. 25 to 27 show a modification of the vertical drain FET of the embodiment shown in FIGS. 22 to 24, in which the arrangement of the source region and the back-gate region 4 of the FET is changed. FIG. 25 is a top view showing the arrangement of a gate electrode, a source region, and a back-gate region, FIG. 26 is a sectional view taken along the line 26—26 of FIG. 25, and FIG. 27 is a sectional view taken along the line 27—27 of FIG. 25.

As shown in FIG. 25, a back-gate region 4 has a cross shape. The back-gate region 4 and the source region contact with the region enclosed by ends of a gate electrode 2. A channel-forming region is present immediately below the gate electrode. When assuming the total length of portions for source regions 3 to contact with the channel-forming region 6 as x and the total length of portions for back-gate regions 4 to contact with the channel-forming region 6 as y, the value of y/x is equal to 0.3.

It is possible to fabricate the structure of this embodiment through ion implantation in self-alignment manner by using the gate electrode-2 portion as a mask without passing through complicated steps. Moreover, because back-gate regions 4 and source regions are efficiently arranged, on-resistance is reduced and it is possible to effectively control parasitic-bipolar operations.

Figure 28:
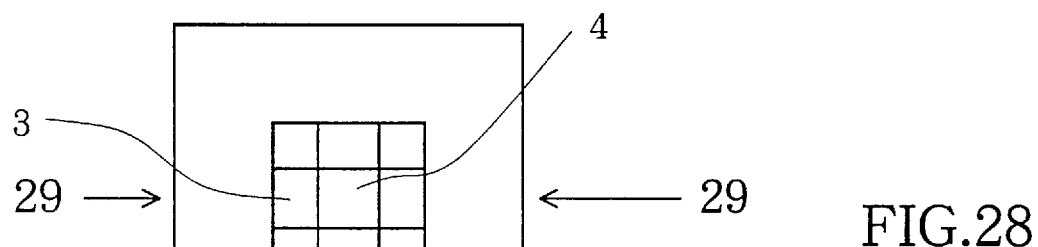
Figure 29:
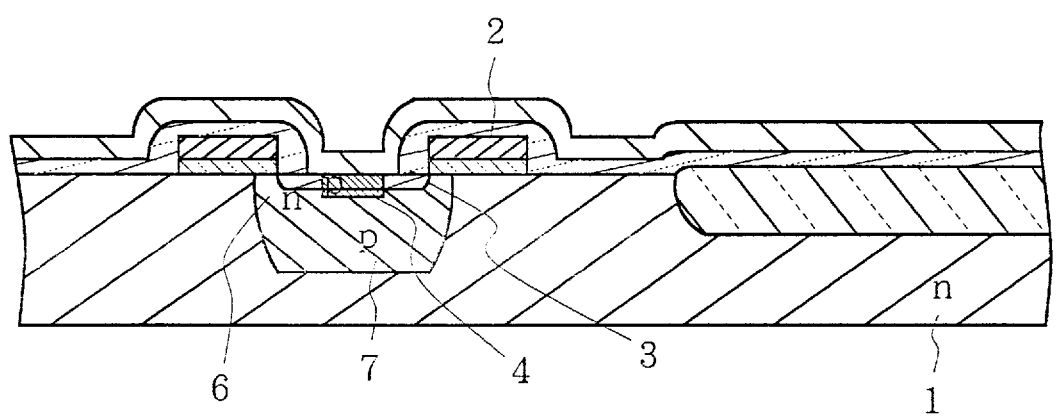
Figure 30:
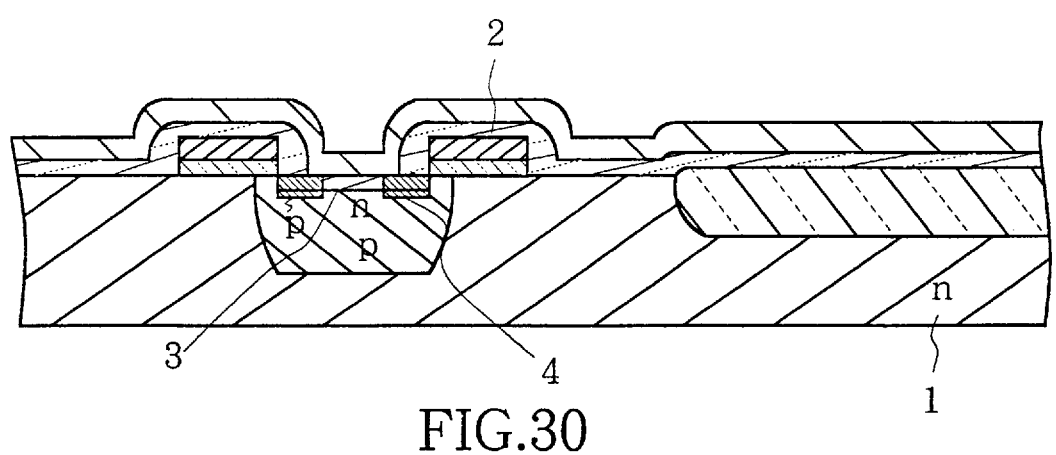

FIGS. 28 to 30 show a modification of the vertical drain FET shown in FIGS. 22 to 24, in which the arrangement of the source region and back-gate region 4 of the FET is changed. FIG. 28 is a top view showing the arrangement of a gate electrode, a source region, and a back-gate region, FIG. 29 is a sectional view taken along the line 29—29 of FIG. 28, and FIG. 30 is a sectional view taken along the line 30—30 of FIG. 28.

Figure 8:
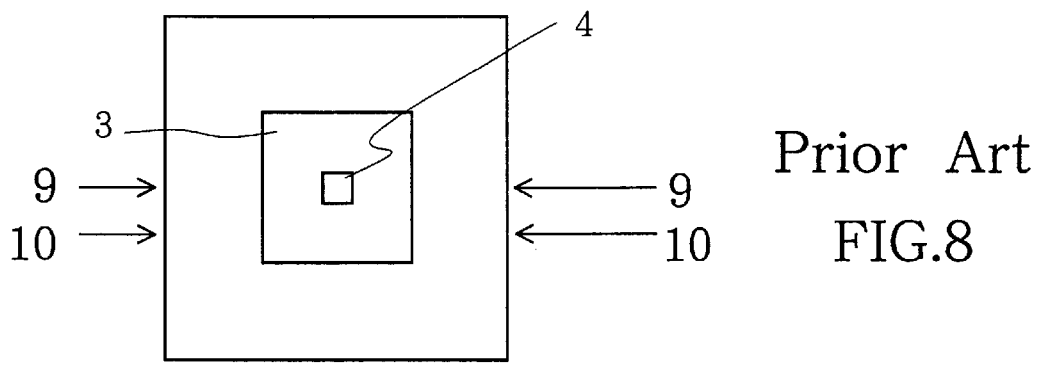
Figure 9:
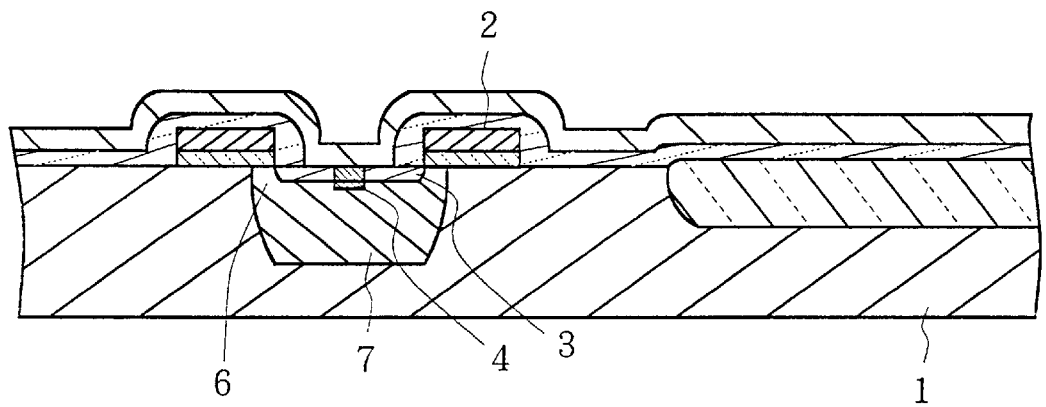
Figure 10:
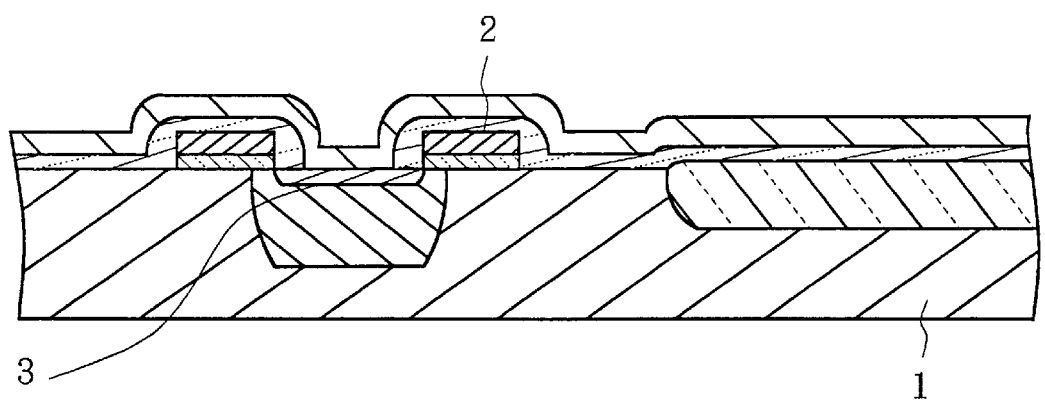

As shown in FIG. 28, the back-gate region 4 is formed like checkers. In the case of this modification, the back-gate region 4 is formed at four places of the portion enclosed by the gate electrode 2. Among these five places, four places at corners contact with the region enclosed by ends of the gate electrode 2 but the back-gate region at the central portion does not contact with the above region. A channel-forming region is present immediately below the gate electrode. When assuming the total length of portions for source regions 3 to contact with the channel-forming region 6 as x and the total length of portions for back-gate regions 4 to contact with the channel-forming region 6 as y, the value of y/x is equal to 0.05. The EDS resistance value ratio of the semiconductor device shown in this example is equal to approx. 1.1 when assuming that of the conventional semiconductor device shown in FIGS. 8 to 10 as 1 and therefore, the improvement effect is small.

Figure 31:
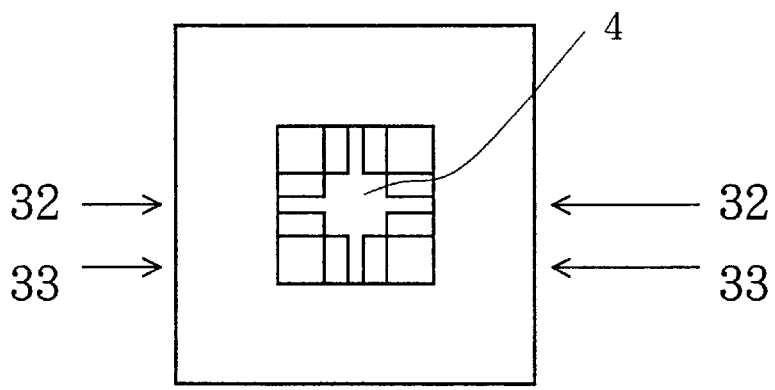
FIGS. 31 to 33 are illustrations showing another embodiment of the present invention, in which FIG. 31 a top view showing the arrangement of a gate electrode, a source region, and a back-gate region.
Figure 32:
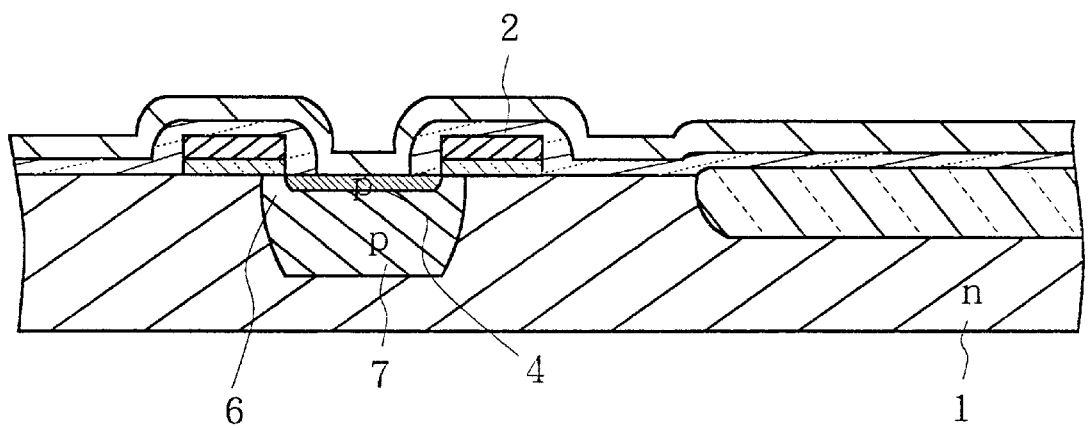
Figure 33:
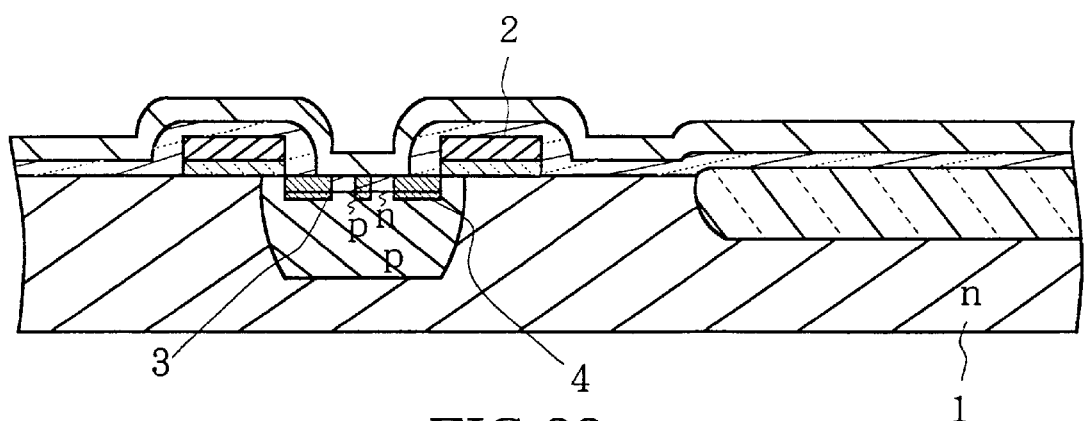

FIGS. 31 to 33 show a modification of the vertical drain FET shown in FIGS. 22 to 24, in which the arrangement of the source region and back-gate region is changed. As shown in FIG. 31, the back-gate region 4 has a shape formed by adding a cross shape to the back-gate region of FIG. 30. The back-gate region 4 and the source region contact with the region enclosed by ends of the gate electrode 2. When assuming the total length of portions for source regions 3 to contact with the channel-forming region 6 as x and the total length of portions for back-gate regions 4 to contact with the channel-forming region 6 as y, the value of y/x is equal to 1.0.

It is possible to fabricate the structure of this embodiment through ion implantation in self-alignment manner by suing the gate electrode-2 portion as a mask without passing through complicated steps. Moreover, because back-gate regions 4 and source regions are efficiently arranged, on-resistance is controlled and it is possible to effectively control parasitic-bipolar operations.

Figure 34:
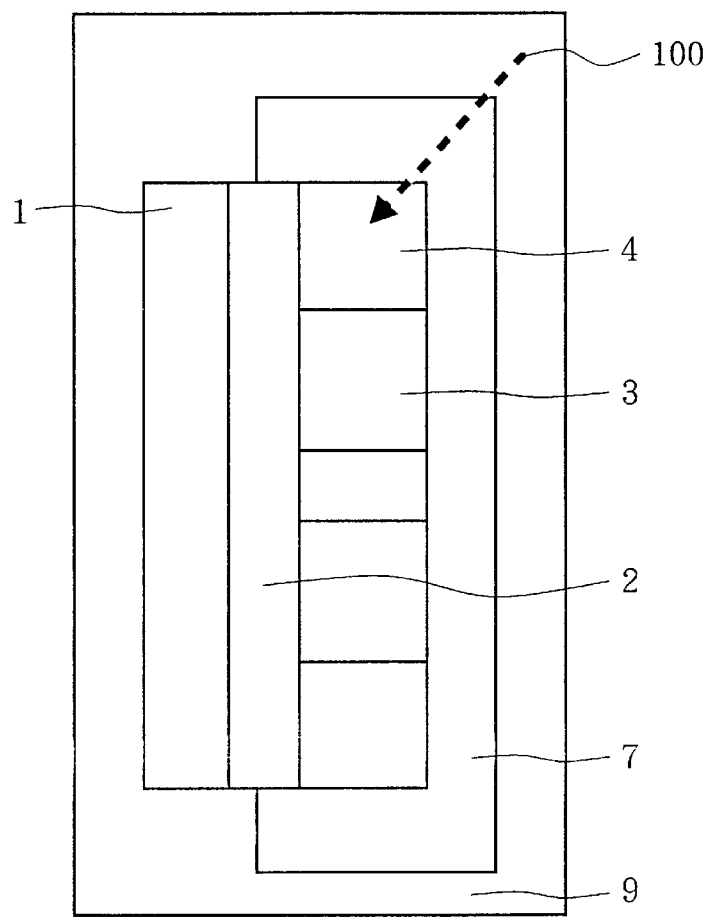
Figure 35:
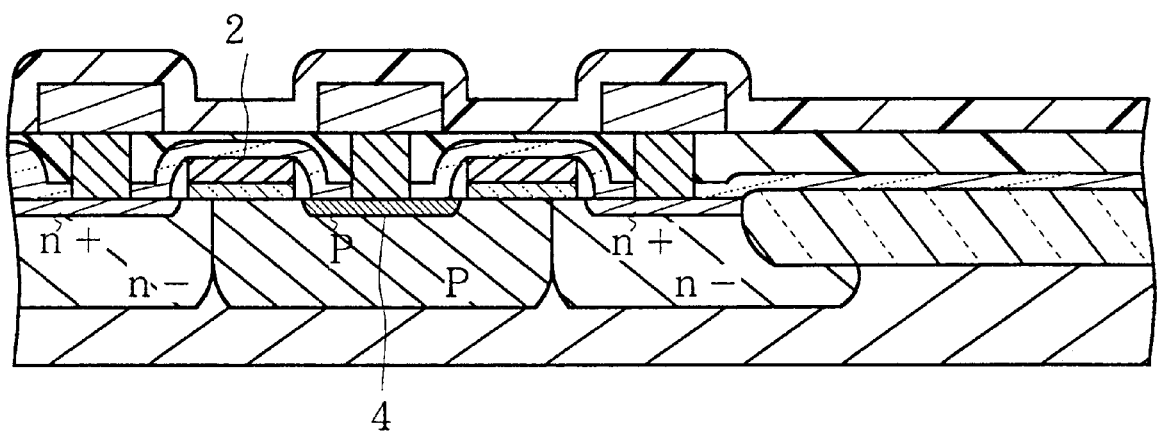

FIGS. 34 and 35 show an embodiment obtained by improving the structure of the stripe end of a horizontal FET. FIG. 34 shows the arrangement of the embodiment in its planar direction and FIG. 35 is a sectional view including a back-gate region. A gate electrode 2 is formed like a stripe and a channel-forming region is present in the region immediately below the gate electrode 2. A plurality of source regions 3 and a plurality of back-gate regions 4 are alternately arranged along the gate electrode 2 (channel-forming region) and the back-gate regions 4 are arranged at the both ends of the gate electrode 2. FIG. 34 shows a current path under breakdown with a reference number 100 which serves as a path shown by the dotted-line arrow. In the case of this embodiment, breakdown resistance is further improved because the back-gate regions 4 are formed at this portion.

Figure 36:
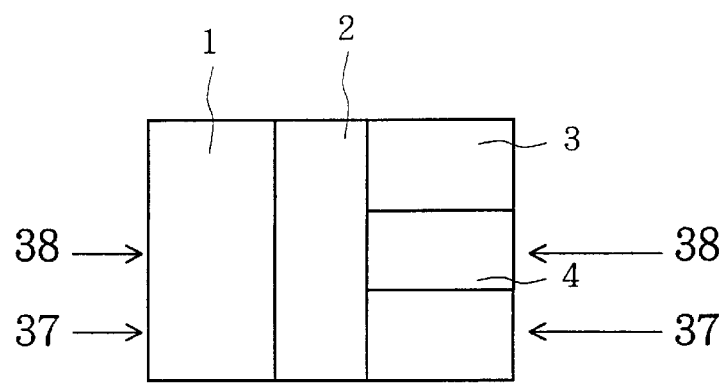
Figure 37:
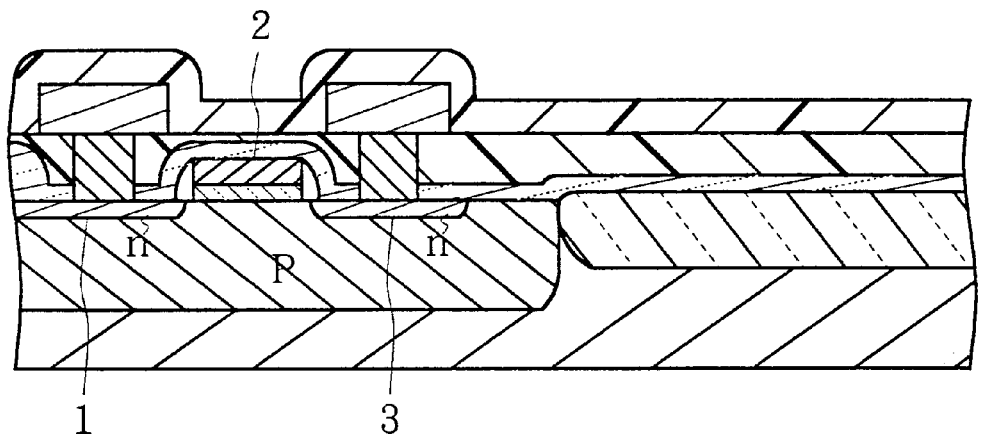
Figure 38:
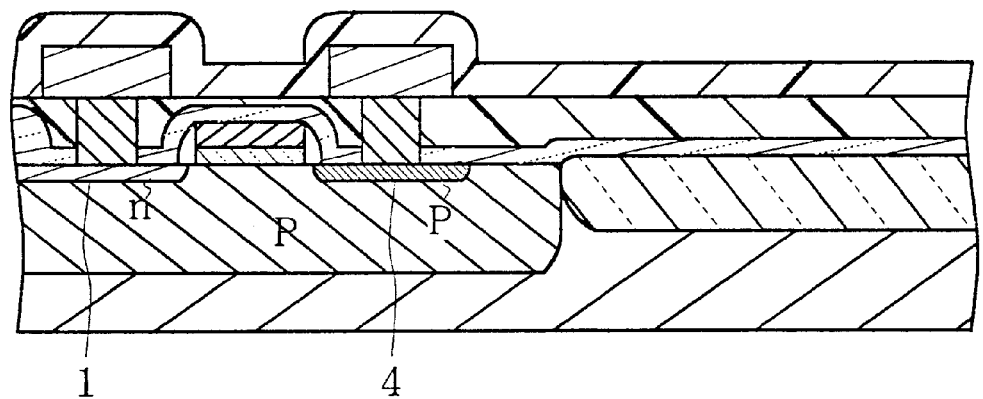

FIGS. 36 to 38 show an embodiment of a small-current FET, in which FIG. 36 is a top view showing the arrangement of a drain region, a gate electrode, a source region, and a back-gate region, FIG. 37 is a sectional view taken along the line 37—37 of FIG. 36, and FIG. 38 is a sectional view taken along the line 38—38 of FIG. 36. In the case of this embodiment, back-gate region 4 and a source region contact with ends of a gate electrode 2. When assuming the total length of portions for source regions 3 to contact with a channel-forming region as x and the total length of portions for back-gate regions 4 to contact with the channel-forming region as y, the value of y/x is equal to 0.7. The source region 3 and the back-gate region 4 are arranged adjacently to each other.

It is possible to fabricate the FET of this embodiment through ion implantation in self-alignment manner without passing through complicated steps by using the gate electrode 2 as a mask. That is, it is possible to fabricate the FET by using the normal MOSIC fabrication process. Moreover, on-resistance is reduced and it is possible to effectively control parasitic-bipolar operations because back-gate regions 4 and source regions are efficiently arranged.

Figure 39:
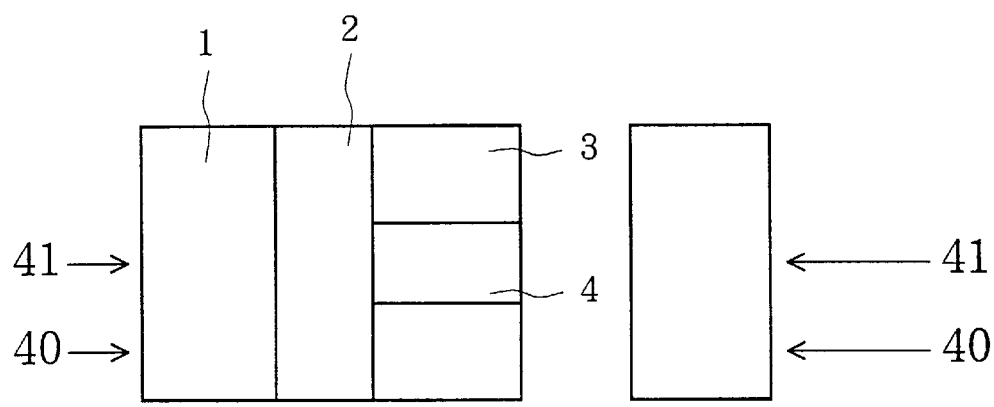
Figure 40:
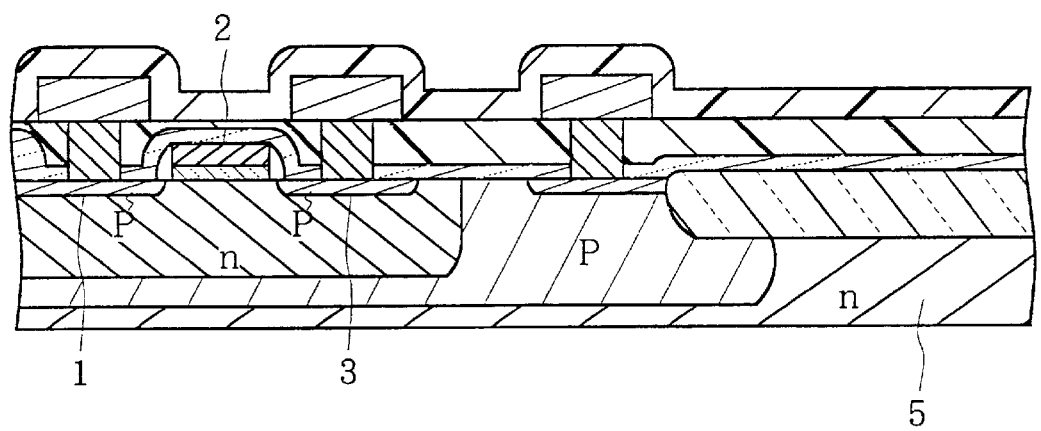
Figure 41:
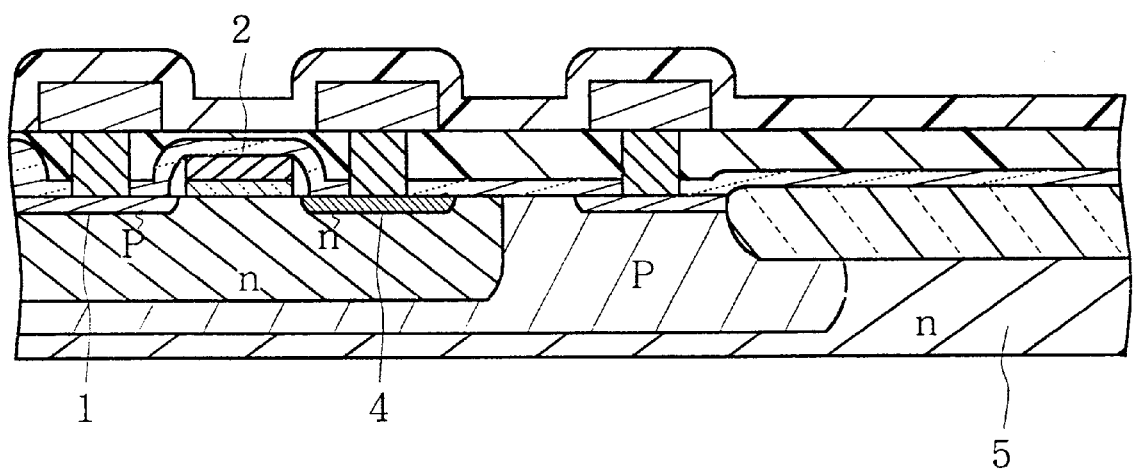

FIGS. 39 to 41 show a p-channel small-current FET using an n-type substrate 5, in which FIG. 39 is a top view showing the arrangement of a drain region, a gate electrode, a source region, and a back-gate region, FIG. 40 is a sectional view taken along the line 40—40 of FIG. 39, and FIG. 41 is a sectional view taken along the line 41—41 of FIG. 39.

A back-gate region 4 and a source region contact with ends of a gate electrode 2. When assuming the total length of portions for source regions 3 to contact with the channel-forming region 6 as x and the total length of portions for back-gate regions 4 to contact with the channel-forming region 6 as y, the value of y/x is equal to 0.6. The source region 3 and the back-gate region 4 are arranged adjacently to each other.

It is possible to fabricate the FET of this embodiment through ion implantation in self-alignment manner without passing through complicated steps by using the gate electrode-2 portion as a mask. That is, it is possible to fabricate the FET by using the normal MOSIC fabrication process. Moreover, because back-gate regions 4 and source regions are efficiently arranged, on-resistance is reduced and it is possible to efficiently control parasitic-bipolar operations.

As clarified from the description of each of the above embodiments, the present invention relates to the structure of the back-gate region of a field-effect transistor but the present invention is not restricted by its gate-electrode structure or drain structure. Moreover, the present invention is not restricted by the difference between IC and discrete, between n-channel and p-channel, between MOSFET and IGBT, or between large current and small current. Furthermore, it is possible to select the optimum value of the area ratio between back-gate region 4 and source region by considering a requested on-resistance and the control effect of parasitic-bipolar operations.

As described above, in the case of a semiconductor device of the present invention, a source region and a back-gate region are arranged so as to be adjacent to a channel-forming region and the back-gate region is formed so as not to substantially include the region immediately below a gate electrode. Therefore, operations of a parasitic bipolar transistor are prevented while controlling the increase of a channel resistance. Thus, the semiconductor device is superior in breakdown resistance.

Moreover, a semiconductor fabrication method of the present invention forms a back-gate region through impurity implantation by using a gate electrode as a mask. Therefore, it is possible to fabricate a back-gate region adjacent to a source region but not substantially including the region immediately below a gate electrode by using the normal MOSIC process.

What is claimed is:

1. A semiconductor device comprising a semiconductor substrate, a gate electrode formed on the semiconductor substrate, and a one-conductivity-type channel-forming region formed at the portion immediately below the gate electrode; wherein an opposite-conductivity-type drain region is formed adjacently to one side of the channel-forming region, an opposite-conductivity-type source region and a one-conductivity-type back-gate region are alternately formed adjacently to the other side of the channel-forming region along the channel-forming region, the back-gate region does not substantially include the region immediately below the gate electrode, and the back-gate region and the source region are connected each other by a wiring.

2. The semiconductor device according to claim 1, wherein a plurality of the source regions and a plurality of the back-gate regions are formed.

3. The semiconductor device according to claim 1, wherein the back-gate regions and the source regions are arranged adjacently to each other.

4. The semiconductor device according to claim 1, wherein, when assuming the total length of portions for the source regions to contact with the channel-forming region as x and the total length of portions for the back-gate regions to contact with the channel-forming region as y, the value of y/x ranges between 0.1 and 1.0 (both included).

5. The semiconductor device according to claim 1, wherein the source regions and the back-gate regions are alternately arranged along the channel-forming region and the back-gate regions are arranged at the both ends of the channel-forming region.

6. A semiconductor device comprising a one-conductivity-type channel-forming region extended in a predetermined direction, an opposite-conductivity-type first region formed along one side of the channel-forming region, an opposite-conductivity-type second region formed along a first portion of the other side of the channel-forming region facing the one side, and the one-conductivity-type back-gate region formed along a second portion of the other side excluding the first portion; wherein the contact surface between the second region and the channel-forming region and the contact surface between the back-gate region and the channel-forming region are formed on the substantially same plane.

7. A semiconductor device comprising a one-conductivity-type channel-forming region extended in a predetermined direction, an opposite-conductivity-type first region formed along one side of the channel-forming region, an opposite-conductivity-type second region formed along a first portion of the other side of the channel-forming region facing the one side, and the one-conductivity-type back-gate region formed along a second portion of the other side excluding the first portion; wherein the contact surface between the second region and the channel-forming region and the contact surface between the back-gate region and the channel-forming region are formed on the same plane so that the back-gate region does not interrupt the operation of carriers between the second region and the channel-forming region.

8. A semiconductor device comprising a semiconductor substrate, a gate electrode formed along the margin of a polygon or circle and a one-conductivity-type channel-forming region formed at the portion immediately below the gate electrode, wherein an opposite-conductivity-type source region and a one-conductivity-type back-gate region are formed at the portion enclosed by the channel-forming region adjacently to the channel-forming region, an opposite-conductivity-type drain region is formed outside of the portion enclosed by the channel-forming region adjacently to the channel-forming region, the back-gate region does not substantially include the region immediately below the gate electrode, and the back-gate region and the source region are connected each other by a wiring.

9. The semiconductor device according to claim 8, wherein the gate electrode is formed along the margin of a polygon.

10. The semiconductor device according to claim 9, wherein a back-gate region is formed inside of corners of the portion enclosed by the channel-forming region so as to contact with the channel-forming region.

11. The semiconductor device according to claim 8, wherein, when assuming the total length of portions for the source regions to contact with the channel-forming region as x and the total length of portions for the back-gate regions to contact with the channel-forming region as y, the value of y/x ranges between 0.1 and 1.0 (both included).

12. A semiconductor device comprising a semiconductor substrate, a one-conductivity-type body well formed nearby the semiconductor substrate, an opposite-conductivity-type source region and a one-conductivity-type back-gate region formed so as to be contained in the body well, and a gate electrode formed on the semiconductor substrate along the margin of the body well so as to bestride the body well; wherein a channel-forming region is formed at the portion immediately below the gate electrode and the back-gate region is formed at the portion enclosed by the channel-forming region adjacently to the channel-forming region.

13. The semiconductor device according to claim 12, wherein the gate electrode is formed along the margin of a polygon.

14. The semiconductor device according to claim 13, wherein a back-gate region is formed inside of corners of the portion enclosed by the channel-forming region.

15. The semi conductor device according to claim 12, wherein, when assuming the total length of portions for the source regions to contact with the channel-forming region as x and the total length of portions for the back-gate regions to contact with the channel-forming region as y, the value of y/x ranges between 0.1 and 1.0 (both included).

* * * * *